United States Patent [19]

Nohr et al.

[11] Patent Number: 5,709,955
[45] Date of Patent: Jan. 20, 1998

[54] ADHESIVE COMPOSITION CURABLE UPON EXPOSURE TO RADIATION AND APPLICATIONS THEREFOR

[75] Inventors: Ronald Sinclair Nohr, Roswell; John Gavin MacDonald, Decatur, both of Ga.

[73] Assignee: Kimberly-Clark Corporation, Neenah, Wis.

[21] Appl. No.: 733,086

[22] Filed: Oct. 16, 1996

Related U.S. Application Data

[60] Continuation of Ser. No. 444,780, May 19, 1995, abandoned, which is a division of Ser. No. 327,077, Oct. 21, 1994, abandoned, and a continuation-in-part of Ser. No. 268,685, Jun. 30, 1994, abandoned.

[51] Int. Cl.$^6$ .................... C08F 2/50; C09J 4/00
[52] U.S. Cl. ............... 428/507; 428/516; 428/424.8; 428/425.1; 156/272.8; 156/273.3; 156/275.5; 156/275.7; 522/2; 522/39; 522/36; 522/42; 522/96
[58] Field of Search .................... 428/523, 507, 428/516, 424.8, 425.1; 430/920, 944; 522/2, 8, 33, 36, 39, 40, 41, 42, 43, 44, 96; 156/272.8, 273.3, 275.5, 275.7

[56] References Cited

U.S. PATENT DOCUMENTS

| | | |
|---|---|---|
| 28,225 | 11/1860 | Heseltine et al. |
| 28,789 | 4/1860 | Chang. |
| 575,228 | 1/1897 | von Gallois. |
| 582,853 | 5/1897 | Feer. |
| 893,636 | 7/1908 | Maywald. |
| 1,013,544 | 1/1912 | Fuerth. |
| 1,325,971 | 12/1919 | Akashi. |
| 1,364,406 | 1/1921 | Olsen. |
| 1,436,856 | 10/1922 | Brenizer et al. |
| 1,744,149 | 1/1930 | Staehlin. |
| 1,803,906 | 5/1931 | Krieger et al. |
| 1,844,199 | 2/1932 | Bicknell et al. |
| 1,876,880 | 9/1932 | Drapal. |
| 1,880,572 | 10/1932 | Wendt et al. |
| 1,880,573 | 10/1932 | Wendt et al. |
| 1,916,350 | 7/1933 | Wendt et al. |
| 1,916,779 | 7/1933 | Wendt et al. |
| 1,955,898 | 4/1934 | Wendt et al. |
| 1,962,111 | 6/1934 | Bamberger. |
| 2,005,378 | 6/1935 | Kiel. |
| 2,049,005 | 7/1936 | Gaspar. |
| 2,054,390 | 9/1936 | Rust et al. |
| 2,058,489 | 10/1936 | Murch et al. |
| 2,062,304 | 12/1936 | Gaspar. |
| 2,090,511 | 8/1937 | Crossley et al. |
| 2,097,119 | 10/1937 | Eggert. |
| 2,106,539 | 1/1938 | Schnitzspahn. |
| 2,111,692 | 3/1938 | Saunders et al. |
| 2,125,015 | 7/1938 | Gaspar. |
| 2,130,572 | 9/1938 | Wendt. |
| 2,132,154 | 10/1938 | Gaspar. |
| 2,145,960 | 2/1939 | Wheatley et al. |

(List continued on next page.)

FOREIGN PATENT DOCUMENTS

| | | |
|---|---|---|
| 103085 | 4/1937 | Australia. |
| 12624/88 | 9/1988 | Australia. |
| 413257 | 10/1932 | Canada. |
| 458808 | 12/1936 | Canada. |
| 460268 | 10/1949 | Canada. |
| 461082 | 11/1949 | Canada. |
| 463021 | 2/1950 | Canada. |
| 463022 | 2/1950 | Canada. |
| 465495 | 5/1950 | Canada. |
| 465496 | 5/1950 | Canada. |
| 465499 | 5/1950 | Canada. |
| 483214 | 5/1952 | Canada. |
| 517364 | 10/1955 | Canada. |
| 537687 | 3/1957 | Canada. |

(List continued on next page.)

OTHER PUBLICATIONS

Kubat et al. "Photophysical properties of metal complexes of meso-tetrakis (40 sulphona to phenyl) porphyrin; "*J. Photochem. and Photobiol.* 96 93–97 1996.

Abstract for WO 95/00343–A1 *Textiles: Paper: Cellulose* p. 7 1995.

Maki, Y. et al. "A novel heterocyclic N–oxide, pyrimido[5,4–g]pteridinetetrone 5–oxide, with multifunctional photo-oxidative properties" *Chemical Abstracts* 122 925 [no 122:31350 F] 1995.

Abstract of patent, JP 6–80915 Canon Inc.), Mar. 22, 1994.

Abstract of patent, JP 0643573 1994.

Pitchumani, K. et al. "Modification of chemical reactivity upon cyclodextrin encapsulation" *Chemical Abstracts* 121 982 [No. 121:13362 4v] 1994.

Derwent Publications Ltd., London, JP 05297627 (Fujiitsu Ltd.), Nov. 12, 1993 (Abstract).

(List continued on next page.)

*Primary Examiner*—Susan W. Berman
*Attorney, Agent, or Firm*—Jones & Askew

[57] ABSTRACT

An adhesive composition, a laminated structure, and a method of laminating a structure. The adhesive composition comprises an admixture of unsaturated polymerizable material and a photoreactor, the photoreactor comprising a wavelength-specific sensitizer covalently bonded to a reactive species-generating photoinitiator. Suitable wavelength-specific sensitizers have a molar extinction coefficient greater than about 5000 liters per mole per cm at an absorption maximum and resulting photoreactors have a quantum yield of greater than about 0.5 at an absorption maximum. Suitable photoreactors include 2-[p-(2-methyllactoyl)phenoxy]ethyl-1,3-dioxo-2-isoindolineacetate, 2-hydroxy-2-methyl-4'-[2-[p-(3-oxobutyl)phenoxy]ethoxy]propiophenone, 4-[p-[(4-benzoylcyclohexyl)oxy]phenyl]-2-butanone, and 1,3-dioxo-2-isoindolineacetic acid diester with 2-hydroxy-4'-(2-hydroxyethoxy)-2-methylpropiophenone. The laminated structure includes at least two layers bonded together with the adhesive composition, in which at least one layer is a cellulosic or polyolefin nonwoven web or film. The laminated structure is made by irradiating the adhesive composition to cure the adhesive composition.

12 Claims, 2 Drawing Sheets

U.S. PATENT DOCUMENTS

| | | |
|---|---|---|
| 2,154,996 | 4/1939 | Rawling . |
| 2,159,280 | 5/1939 | Mannes et al. . |
| 2,171,976 | 9/1939 | Erickson . |
| 2,181,800 | 11/1939 | Crossley et al. . |
| 2,185,153 | 12/1939 | Lecher et al. . |
| 2,220,178 | 11/1940 | Schneider . |
| 2,230,590 | 2/1941 | Eggert et al. . |
| 2,237,885 | 4/1941 | Markush et al. . |
| 2,242,431 | 12/1941 | Hara et al. . |
| 2,268,324 | 12/1941 | Polgar . |
| 2,281,895 | 5/1942 | van Poser et al. . |
| 2,328,166 | 8/1943 | Poigar et al. . |
| 2,346,090 | 4/1944 | Staehle . |
| 2,349,090 | 5/1944 | Haddock . |
| 2,356,618 | 8/1944 | Rossander et al. . |
| 2,361,301 | 10/1944 | Libby, Jr. et al. . |
| 2,364,359 | 12/1944 | Kienle et al. . |
| 2,381,145 | 8/1945 | von Glahn et al. . |
| 2,382,904 | 8/1945 | Federsen . |
| 2,386,646 | 10/1945 | Adams et al. . |
| 2,402,106 | 6/1946 | von Glahn et al. . |
| 2,416,145 | 2/1947 | Biro . |
| 2,477,165 | 7/1949 | Bergstrom . |
| 2,527,347 | 10/1950 | Bergstrom . |
| 2,580,461 | 1/1952 | Pearl . |
| 2,601,669 | 6/1952 | Tullsen . |
| 2,612,494 | 9/1952 | von Glahn et al. . |
| 2,612,495 | 9/1952 | von Glahn et al. . |
| 2,628,959 | 2/1953 | von Glahn et al. . |
| 2,647,080 | 7/1953 | Joyce . |
| 2,680,685 | 6/1954 | Ratchford . |
| 2,728,784 | 12/1955 | Tholstrup et al. . |
| 2,732,301 | 1/1956 | Robertson et al. . |
| 2,744,103 | 5/1956 | Koch . |
| 2,757,090 | 7/1956 | Meugebauer et al. . |
| 2,763,550 | 9/1956 | Lovick . |
| 2,768,171 | 10/1956 | Clarke et al. . |
| 2,773,056 | 12/1956 | Helfaer . |
| 2,798,000 | 7/1957 | Monterman . |
| 2,809,189 | 10/1957 | Stanley et al. . |
| 2,827,358 | 3/1958 | Kaplan et al. . |
| 2,834,773 | 5/1958 | Scalera et al. . |
| 2,875,045 | 2/1959 | Lurie . |
| 2,892,865 | 6/1959 | Giraldi et al. . |
| 2,897,187 | 7/1959 | Koch . |
| 2,936,241 | 5/1960 | Sharp et al. . |
| 2,940,853 | 6/1960 | Sagura et al. . |
| 2,955,067 | 10/1960 | McBurney et al. . |
| 2,992,129 | 7/1961 | Gauthier . |
| 2,992,198 | 7/1961 | Funahashi . |
| 3,030,208 | 4/1962 | Schellenberg et al. . |
| 3,071,815 | 1/1963 | MacKinnon . |
| 3,075,014 | 1/1963 | Palopoli et al. . |
| 3,104,973 | 9/1963 | Sprague et al. . |
| 3,114,634 | 12/1963 | Brown et al. . |
| 3,121,632 | 2/1964 | Sprague et al. . |
| 3,123,647 | 3/1964 | Duennenberger et al. . |
| 3,133,049 | 5/1964 | Hertel et al. . |
| 3,140,949 | 7/1964 | Sprague et al. . |
| 3,154,416 | 10/1964 | Fidelman . |
| 3,155,509 | 11/1964 | Roscow . |
| 3,175,905 | 3/1965 | Wiesbaden . |
| 3,178,285 | 4/1965 | Anderau et al. . |
| 3,238,163 | 3/1966 | O'Neill . |
| 3,242,215 | 3/1966 | Heitmiller . |
| 3,266,973 | 8/1966 | Crowley . |
| 3,282,886 | 11/1966 | Gadecki . |
| 3,284,205 | 11/1966 | Sprague et al. . |
| 3,300,314 | 1/1967 | Rauner et al. . |
| 3,304,297 | 2/1967 | Wegmann et al. . |
| 3,305,361 | 2/1967 | Gaynor et al. . |
| 3,313,797 | 4/1967 | Kissa . |
| 3,330,659 | 7/1967 | Wainer . |
| 3,359,109 | 12/1967 | Harder et al. . |
| 3,361,827 | 1/1968 | Biletch . |
| 3,363,969 | 1/1968 | Brooks . |
| 3,385,700 | 5/1968 | Willems et al. . |
| 3,397,984 | 8/1968 | Williams et al. . |
| 3,415,875 | 12/1968 | Luethi et al. . |
| 3,418,118 | 12/1968 | Thommes et al. . |
| 3,445,234 | 5/1969 | Cescon et al. . |
| 3,453,258 | 7/1969 | Parmerter et al. . |
| 3,453,259 | 7/1969 | Parmerter et al. . |
| 3,464,841 | 9/1969 | Skofronick . |
| 3,479,185 | 11/1969 | Chambers . |
| 3,502,476 | 3/1970 | Kohei et al. . |
| 3,503,744 | 3/1970 | Itano et al. . |
| 3,514,597 | 5/1970 | Haes et al. . |
| 3,541,142 | 11/1970 | Cragoe, Jr. . |
| 3,547,646 | 12/1970 | Hori et al. . |
| 3,549,367 | 12/1970 | Chang et al. . |
| 3,553,710 | 1/1971 | Lloyd et al. . |
| 3,563,931 | 2/1971 | Horiguchi . |
| 3,565,753 | 2/1971 | Yurkowitz . |
| 3,574,624 | 4/1971 | Reynolds et al. . |
| 3,595,655 | 7/1971 | Robinson et al. . |
| 3,595,657 | 7/1971 | Robinson et al. . |
| 3,595,658 | 7/1971 | Gerlach et al. . |
| 3,595,659 | 7/1971 | Gerlach et al. . |
| 3,607,639 | 9/1971 | Krefeld et al. . |
| 3,607,693 | 9/1971 | Heine et al. . |
| 3,607,863 | 9/1971 | Doscl . |
| 3,615,562 | 10/1971 | Harrison et al. . |
| 3,617,288 | 11/1971 | Hartman et al. . |
| 3,617,335 | 11/1971 | Kumura et al. . |
| 3,619,238 | 11/1971 | Kimura et al. . |
| 3,619,239 | 11/1971 | Osada et al. . |
| 3,637,337 | 1/1972 | Pilling . |
| 3,637,581 | 1/1972 | Horioguchi et al. . |
| 3,642,472 | 2/1972 | Mayo . |
| 3,647,467 | 3/1972 | Grubb . |
| 3,652,275 | 3/1972 | Baum et al. . |
| 3,660,542 | 5/1972 | Adachi et al. . |
| 3,667,954 | 6/1972 | Itano et al. . |
| 3,668,188 | 6/1972 | King et al. . |
| 3,669,925 | 6/1972 | King et al. . |
| 3,671,096 | 6/1972 | Mackin . |
| 3,671,251 | 6/1972 | Houle et al. . |
| 3,676,690 | 7/1972 | McMillin et al. . |
| 3,678,044 | 7/1972 | Adams . |
| 3,689,565 | 9/1972 | Hoffmann et al. . |
| 3,694,241 | 9/1972 | Guthrie et al. . |
| 3,695,879 | 10/1972 | Laming et al. . |
| 3,697,280 | 10/1972 | Strilko . |
| 3,705,043 | 12/1972 | Zablak . |
| 3,707,371 | 12/1972 | Files . |
| 3,729,313 | 4/1973 | Smith . |
| 3,737,628 | 6/1973 | Azure . |
| 3,765,896 | 10/1973 | Fox . |
| 3,775,130 | 11/1973 | Enomoto et al. . |
| 3,788,849 | 1/1974 | Taguchi et al. . |
| 3,799,773 | 3/1974 | Watarai et al. . |
| 3,800,439 | 4/1974 | Sokolski et al. . |
| 3,801,329 | 4/1974 | Sandner et al. . |
| 3,817,752 | 6/1974 | Laridon et al. . |
| 3,840,338 | 10/1974 | Zviak et al. . |
| 3,844,790 | 10/1974 | Chang et al. . |
| 3,870,524 | 3/1975 | Watanabe et al. . |
| 3,873,500 | 3/1975 | Kato et al. . |
| 3,876,496 | 4/1975 | Lozano . |
| 3,887,450 | 6/1975 | Gilano et al. . |
| 3,895,949 | 7/1975 | Akamatsu . |

| Patent No. | Date | Name | Class |
|---|---|---|---|
| 3,901,779 | 8/1975 | Mani . | |
| 3,910,993 | 10/1975 | Avar et al. . | |
| 3,914,165 | 10/1975 | Gaske . | |
| 3,914,166 | 10/1975 | Rudolph et al. | 204/159.15 |
| 3,915,824 | 10/1975 | McGinnis | 204/159.23 |
| 3,919,323 | 11/1975 | Houlihan et al. . | |
| 3,926,641 | 12/1975 | Rosen . | |
| 3,928,264 | 12/1975 | Young, Jr. et al. . | |
| 3,933,682 | 1/1976 | Bean . | |
| 3,952,129 | 4/1976 | Matsukawa et al. . | |
| 3,960,685 | 6/1976 | Sano et al. . | |
| 3,965,157 | 6/1976 | Harrison . | |
| 3,978,132 | 8/1976 | Houlihan et al. . | |
| 3,984,248 | 10/1976 | Sturmer . | |
| 3,988,154 | 10/1976 | Sturmer . | |
| 4,004,998 | 1/1977 | Rosen . | |
| 4,012,256 | 3/1977 | Levinos . | |
| 4,017,652 | 4/1977 | Gruber . | |
| 4,022,674 | 5/1977 | Rosen . | |
| 4,024,324 | 5/1977 | Sparks . | |
| 4,039,332 | 8/1977 | Kokelenberg et al. . | |
| 4,043,819 | 8/1977 | Baumann . | |
| 4,048,034 | 9/1977 | Martan . | |
| 4,054,719 | 10/1977 | Cordes, III . | |
| 4,056,665 | 11/1977 | Tayler et al. . | |
| 4,058,400 | 11/1977 | Crivello . | |
| 4,067,892 | 1/1978 | Thorne et al. . | |
| 4,071,424 | 1/1978 | Dart et al. . | |
| 4,073,968 | 2/1978 | Miyamoto et al. . | |
| 4,079,183 | 3/1978 | Green . | |
| 4,090,877 | 5/1978 | Streeper . | |
| 4,100,047 | 7/1978 | McCarty . | |
| 4,105,572 | 8/1978 | Gorondy . | |
| 4,107,733 | 8/1978 | Schickedanz . | |
| 4,110,112 | 8/1978 | Roman et al. . | |
| 4,111,699 | 9/1978 | Krueger . | |
| 4,114,028 | 9/1978 | Baio et al. . | |
| 4,126,412 | 11/1978 | Masson et al. . | |
| 4,141,807 | 2/1979 | Via . | |
| 4,144,156 | 3/1979 | Kuesters et al. . | |
| 4,148,658 | 4/1979 | Kondoh et al. | 204/159.24 |
| 4,162,162 | 7/1979 | Dueber | 96/115 P |
| 4,171,977 | 10/1979 | Hasegawa et al. . | |
| 4,179,577 | 12/1979 | Green . | |
| 4,181,807 | 1/1980 | Green . | |
| 4,190,671 | 2/1980 | Vanstone et al. . | |
| 4,197,080 | 4/1980 | Mee . | |
| 4,199,420 | 4/1980 | Photis . | |
| 4,229,172 | 10/1980 | Baumann et al. . | |
| 4,232,106 | 11/1980 | Iwasaki et al. . | |
| 4,238,492 | 12/1980 | Majoie . | |
| 4,239,843 | 12/1980 | Hara et al. . | |
| 4,239,850 | 12/1980 | Kita et al. . | |
| 4,241,155 | 12/1980 | Hara et al. . | |
| 4,242,430 | 12/1980 | Hara et al. . | |
| 4,245,018 | 1/1981 | Hara et al. . | |
| 4,245,995 | 1/1981 | Hugl et al. . | |
| 4,246,330 | 1/1981 | Hara et al. . | |
| 4,248,949 | 2/1981 | Hara et al. . | |
| 4,250,096 | 2/1981 | Kvita et al. . | |
| 4,251,622 | 2/1981 | Kimoto et al. . | |
| 4,254,195 | 3/1981 | Hara et al. . | |
| 4,256,493 | 3/1981 | Yokoyama et al. . | |
| 4,256,817 | 3/1981 | Hara et al. . | |
| 4,258,123 | 3/1981 | Nagashima et al. . | |
| 4,258,367 | 3/1981 | Mansukhani . | |
| 4,259,432 | 3/1981 | Kondoh et al. . | |
| 4,262,936 | 4/1981 | Miyamoto . | |
| 4,268,605 | 5/1981 | Hara et al. . | |
| 4,268,667 | 5/1981 | Anderson . | |
| 4,269,926 | 5/1981 | Hara et al. . | |
| 4,270,130 | 5/1981 | Houle et al. . | |
| 4,271,252 | 6/1981 | Hara et al. . | |
| 4,271,253 | 6/1981 | Hara et al. . | |
| 4,272,244 | 6/1981 | Schlick . | |
| 4,276,211 | 6/1981 | Singer et al. . | |
| 4,277,497 | 7/1981 | Fromantin . | |
| 4,279,653 | 7/1981 | Makishima et al. . | |
| 4,279,982 | 7/1981 | Iwasaki et al. . | |
| 4,279,985 | 7/1981 | Nonogaki et al. . | |
| 4,284,485 | 8/1981 | Berner . | |
| 4,288,631 | 9/1981 | Ching . | |
| 4,289,844 | 9/1981 | Specht et al. . | |
| 4,290,870 | 9/1981 | Kondoh et al. . | |
| 4,293,458 | 10/1981 | Gruenberger et al. . | |
| 4,298,679 | 11/1981 | Shinozaki et al. . | |
| 4,300,123 | 11/1981 | McMillin et al. . | |
| 4,301,223 | 11/1981 | Nakamura et al. . | |
| 4,302,606 | 11/1981 | Barabas et al. . | |
| 4,306,014 | 12/1981 | Kunikane et al. . | |
| 4,307,182 | 12/1981 | Dalzell et al. . | |
| 4,308,400 | 12/1981 | Felder et al. . | |
| 4,315,807 | 2/1982 | Felder et al. . | |
| 4,318,705 | 3/1982 | Nowak et al. . | |
| 4,318,791 | 3/1982 | Felder et al. . | |
| 4,321,118 | 3/1982 | Felder et al. . | |
| 4,335,054 | 6/1982 | Blaser et al. . | |
| 4,335,055 | 6/1982 | Blaser et al. . | |
| 4,336,323 | 6/1982 | Winslow . | |
| 4,343,891 | 8/1982 | Aasen et al. . | |
| 4,345,011 | 8/1982 | Drexhage . | |
| 4,347,111 | 8/1982 | Gehlhaus et al. . | |
| 4,349,617 | 9/1982 | Kawashiri et al. . | |
| 4,350,753 | 9/1982 | Shelnut et al. . | |
| 4,351,893 | 9/1982 | Anderson . | |
| 4,356,255 | 10/1982 | Tachikawa et al. . | |
| 4,357,468 | 11/1982 | Szejtli et al. . | |
| 4,359,524 | 11/1982 | Masuda et al. . | |
| 4,362,806 | 12/1982 | Whitmore . | |
| 4,367,072 | 1/1983 | Vogtle et al. . | |
| 4,367,280 | 1/1983 | Kondo et al. . | |
| 4,369,283 | 1/1983 | Altschuler . | |
| 4,370,401 | 1/1983 | Winslow et al. . | |
| 4,372,582 | 2/1983 | Geisler . | |
| 4,373,017 | 2/1983 | Masukawa et al. . | |
| 4,373,020 | 2/1983 | Winslow . | |
| 4,374,984 | 2/1983 | Eichler et al. . | |
| 4,376,887 | 3/1983 | Greenaway et al. . | |
| 4,383,835 | 5/1983 | Preuss et al. . | |
| 4,390,616 | 6/1983 | Sato et al. . | |
| 4,391,867 | 7/1983 | Derick et al. . | |
| 4,399,209 | 8/1983 | Sanders et al. | 430/138 |
| 4,401,470 | 8/1983 | Bridger . | |
| 4,416,961 | 11/1983 | Drexhage . | |
| 4,421,559 | 12/1983 | Owatari . | |
| 4,424,325 | 1/1984 | Tsunoda et al. . | |
| 4,425,162 | 1/1984 | Sugiyama . | |
| 4,425,424 | 1/1984 | Altland et al. . | |
| 4,426,153 | 1/1984 | Libby et al. . | |
| 4,434,035 | 2/1984 | Eichler et al. . | |
| 4,447,521 | 5/1984 | Tiers et al. . | |
| 4,450,227 | 5/1984 | Holmes et al. . | |
| 4,460,676 | 7/1984 | Fabel . | |
| 4,467,112 | 8/1984 | Matsuura et al. . | |
| 4,475,999 | 10/1984 | Via . | |
| 4,477,681 | 10/1984 | Gehlhaus et al. . | |
| 4,489,334 | 12/1984 | Owatari . | |
| 4,495,041 | 1/1985 | Goldstein . | |
| 4,496,447 | 1/1985 | Eichler et al. | 204/159.16 |
| 4,500,355 | 2/1985 | Shimada et al. . | |
| 4,508,570 | 4/1985 | Fugii et al. . | |
| 4,510,392 | 4/1985 | Litt et al. . | |
| 4,523,924 | 6/1985 | Lacroix . | |
| 4,524,122 | 6/1985 | Weber et al. . | |

| | | |
|---|---|---|
| 4,534,838 | 8/1985 | Lin et al. . |
| 4,548,896 | 10/1985 | Sabongi et al. . |
| 4,555,474 | 11/1985 | Kawamura . |
| 4,557,730 | 12/1985 | Bennett et al. . |
| 4,565,769 | 1/1986 | Dueber et al. . |
| 4,567,171 | 1/1986 | Mangum . |
| 4,571,377 | 2/1986 | McGinniss et al. . |
| 4,595,745 | 6/1986 | Nakano et al. . |
| 4,604,344 | 8/1986 | Irving et al. . |
| 4,605,442 | 8/1986 | Kawashita et al. . |
| 4,613,334 | 9/1986 | Thomas et al. . |
| 4,617,380 | 10/1986 | Hinson et al. . |
| 4,620,875 | 11/1986 | Shimada et al. . |
| 4,620,876 | 11/1986 | Fugii et al. . |
| 4,622,286 | 11/1986 | Sheets . |
| 4,631,085 | 12/1986 | Kawanishi et al. . |
| 4,632,891 | 12/1986 | Banks et al. . |
| 4,632,895 | 12/1986 | Patel et al. . |
| 4,634,644 | 1/1987 | Irving et al. . |
| 4,638,340 | 1/1987 | Iiyama et al. . |
| 4,647,310 | 3/1987 | Shimada et al. . |
| 4,655,783 | 4/1987 | Reinert et al. . |
| 4,663,275 | 5/1987 | West et al. . |
| 4,663,641 | 5/1987 | Iiyama et al. . |
| 4,668,533 | 5/1987 | Miller . |
| 4,672,041 | 6/1987 | Jain . |
| 4,698,291 | 10/1987 | Koibuchi et al. . |
| 4,701,402 | 10/1987 | Patel et al. . |
| 4,702,996 | 10/1987 | Griffing et al. . |
| 4,707,161 | 11/1987 | Thomas et al. . |
| 4,707,425 | 11/1987 | Sasagawa et al. . |
| 4,707,430 | 11/1987 | Ozawa et al. . |
| 4,711,668 | 12/1987 | Shimada et al. . |
| 4,713,113 | 12/1987 | Shimada et al. . |
| 4,720,450 | 1/1988 | Ellis . |
| 4,721,531 | 1/1988 | Wildeman et al. . |
| 4,721,734 | 1/1988 | Gehlhaus et al. . |
| 4,724,021 | 2/1988 | Martin et al. . |
| 4,724,201 | 2/1988 | Okazaki et al. . |
| 4,725,527 | 2/1988 | Robillard . |
| 4,727,824 | 3/1988 | Ducharme et al. . |
| 4,732,615 | 3/1988 | Kawashita et al. . |
| 4,737,190 | 4/1988 | Shimada et al. . |
| 4,737,438 | 4/1988 | Ito et al. . |
| 4,740,451 | 4/1988 | Kohara . |
| 4,745,042 | 5/1988 | Sasago et al. . |
| 4,752,341 | 6/1988 | Rock . |
| 4,755,450 | 7/1988 | Sanders et al. . |
| 4,761,181 | 8/1988 | Suzuki . |
| 4,766,050 | 8/1988 | Jerry . |
| 4,766,055 | 8/1988 | Kawabata et al. . |
| 4,770,667 | 9/1988 | Evans et al. . |
| 4,771,802 | 9/1988 | Tannenbaum . |
| 4,772,291 | 9/1988 | Shibanai et al. . |
| 4,772,541 | 9/1988 | Gotschalk . |
| 4,775,836 | 10/1988 | Reinert et al. . |
| 4,786,586 | 11/1988 | Lee et al. . |
| 4,789,382 | 12/1988 | Neumann et al. . |
| 4,790,565 | 12/1988 | Steed . |
| 4,800,149 | 1/1989 | Gottschalk . |
| 4,803,008 | 2/1989 | Ciolino et al. . |
| 4,808,189 | 2/1989 | Oishi et al. . |
| 4,812,139 | 3/1989 | Brodmann . |
| 4,812,517 | 3/1989 | West . |
| 4,813,970 | 3/1989 | Kirjanov et al. . |
| 4,822,714 | 4/1989 | Sanders ........................ 430/138 |
| 4,831,068 | 5/1989 | Reinert et al. . |
| 4,837,106 | 6/1989 | Ishikawa et al. . |
| 4,837,331 | 6/1989 | Yamanishi et al. . |
| 4,838,938 | 6/1989 | Tomida et al. . |
| 4,839,269 | 6/1989 | Okazaki et al. . |
| 4,849,320 | 7/1989 | Irving et al. . |
| 4,853,037 | 8/1989 | Johnson et al. . |
| 4,853,398 | 8/1989 | Carr et al. . |
| 4,854,971 | 8/1989 | Gane et al. . |
| 4,857,438 | 8/1989 | Loerzer et al. . |
| 4,861,916 | 8/1989 | Kohler et al. . |
| 4,865,942 | 9/1989 | Gottschalk et al. . |
| 4,874,391 | 10/1989 | Reinert . |
| 4,874,899 | 10/1989 | Hoelderich et al. . |
| 4,885,395 | 12/1989 | Hoelderich . |
| 4,886,774 | 12/1989 | Doi . |
| 4,895,880 | 1/1990 | Gottschalk . |
| 4,900,581 | 2/1990 | Stuke et al. . |
| 4,902,299 | 2/1990 | Anton . |
| 4,902,725 | 2/1990 | Moore . |
| 4,902,787 | 2/1990 | Freeman . |
| 4,911,732 | 3/1990 | Neumann et al. . |
| 4,911,899 | 3/1990 | Hagiwara et al. . |
| 4,917,956 | 4/1990 | Rohrbach . |
| 4,921,317 | 5/1990 | Suzuki et al. . |
| 4,925,770 | 5/1990 | Ichiura et al. . |
| 4,925,777 | 5/1990 | Inoue et al. . |
| 4,926,190 | 5/1990 | Lavar . |
| 4,933,265 | 6/1990 | Inoue et al. . |
| 4,933,948 | 6/1990 | Herkstroeter . |
| 4,937,161 | 6/1990 | Kita et al. . |
| 4,942,113 | 7/1990 | Trundle . |
| 4,950,304 | 8/1990 | Reinert et al. . |
| 4,952,478 | 8/1990 | Miyagawa et al. . |
| 4,952,680 | 8/1990 | Schmeidl . |
| 4,954,380 | 9/1990 | Kanome et al. . |
| 4,956,254 | 9/1990 | Washizu et al. . |
| 4,964,871 | 10/1990 | Reinert et al. . |
| 4,965,294 | 10/1990 | Ohngemach et al. . |
| 4,966,607 | 10/1990 | Shinoki et al. . |
| 4,966,833 | 10/1990 | Inoue . |
| 4,968,596 | 11/1990 | Inoue et al. . |
| 4,968,813 | 11/1990 | Rule et al. . |
| 4,985,345 | 1/1991 | Hayakawa et al. . |
| 4,987,056 | 1/1991 | Imahashi et al. . |
| 4,988,561 | 1/1991 | Wason . |
| 4,997,745 | 3/1991 | Kawamura et al. . |
| 5,001,330 | 3/1991 | Koch . |
| 5,002,853 | 3/1991 | Aoai et al. . |
| 5,002,993 | 3/1991 | West et al. . |
| 5,003,142 | 3/1991 | Fuller . |
| 5,006,758 | 4/1991 | Gellert et al. . |
| 5,013,959 | 5/1991 | Kogelschatz . |
| 5,017,195 | 5/1991 | Satou et al. . |
| 5,023,129 | 6/1991 | Morganti et al. . |
| 5,025,036 | 6/1991 | Carson et al. . |
| 5,026,425 | 6/1991 | Hindagolla et al. . |
| 5,026,427 | 6/1991 | Mitchell et al. . |
| 5,028,262 | 7/1991 | Barlow, Jr. et al. . |
| 5,028,792 | 7/1991 | Mullis . |
| 5,030,243 | 7/1991 | Reinert . |
| 5,030,248 | 7/1991 | Meszaros . |
| 5,034,526 | 7/1991 | Bonham et al. . |
| 5,037,726 | 8/1991 | Kojima et al. . |
| 5,045,435 | 9/1991 | Adams et al. . |
| 5,045,573 | 9/1991 | Kohler et al. ........................ 522/42 |
| 5,047,556 | 9/1991 | Kohler et al. . |
| 5,049,777 | 9/1991 | Mechtersheimer . |
| 5,053,320 | 10/1991 | Robbillard . |
| 5,055,579 | 10/1991 | Pawlowski et al. . |
| 5,057,562 | 10/1991 | Reinert . |
| 5,069,681 | 12/1991 | Bouwknegt et al. . |
| 5,070,001 | 12/1991 | Stahlhofen . |
| 5,073,448 | 12/1991 | Vieira et al. . |
| 5,074,885 | 12/1991 | Reinert . |
| 5,076,808 | 12/1991 | Hahn et al. . |
| 5,085,698 | 2/1992 | Ma et al. . |
| 5,087,550 | 2/1992 | Blum et al. . |

| | | | | | | |
|---|---|---|---|---|---|---|
| 5,089,050 | 2/1992 | Vieira et al. . | | 5,268,027 | 12/1993 | Chan et al. . |
| 5,089,374 | 2/1992 | Saeva .................................. 430/271 | | 5,270,078 | 12/1993 | Walker et al. . |
| 5,096,456 | 3/1992 | Reinert et al. . | | 5,271,765 | 12/1993 | Ma . |
| 5,096,489 | 3/1992 | Laver . | | 5,272,201 | 12/1993 | Ma et al. . |
| 5,096,781 | 3/1992 | Vieira et al. . | | 5,275,646 | 1/1994 | Marshall et al. . |
| 5,098,477 | 3/1992 | Vieira et al. . | | 5,279,652 | 1/1994 | Kaufmann et al. . |
| 5,098,793 | 3/1992 | Rohrbach et al. . | | 5,284,734 | 2/1994 | Blum et al. . |
| 5,098,806 | 3/1992 | Robillard . | | 5,286,288 | 2/1994 | Tobias et al. . |
| 5,106,723 | 4/1992 | West et al. . | | 5,294,528 | 3/1994 | Furutachi . |
| 5,108,505 | 4/1992 | Moffat . | | 5,296,275 | 3/1994 | Goman et al. . |
| 5,108,874 | 4/1992 | Griffing et al. . | | 5,296,556 | 3/1994 | Frihart . |
| 5,110,706 | 5/1992 | Yumoto et al. . | | 5,298,030 | 3/1994 | Burdeska et al. . |
| 5,110,709 | 5/1992 | Aoai et al. . | | 5,300,403 | 4/1994 | Angelopolus et al. . |
| 5,114,832 | 5/1992 | Zertani et al. . | | 5,300,654 | 4/1994 | Nakajima et al. . |
| 5,124,723 | 6/1992 | Laver . | | 5,302,195 | 4/1994 | Helbrecht . |
| 5,130,227 | 7/1992 | Wade et al. . | | 5,302,197 | 4/1994 | Wickramanayke et al. . |
| 5,133,803 | 7/1992 | Moffatt . | | 5,310,778 | 5/1994 | Shor et al. . |
| 5,135,940 | 8/1992 | Belander et al. . | | 5,312,713 | 5/1994 | Yokoyama et al. . |
| 5,139,572 | 8/1992 | Kawashima . | | 5,312,721 | 5/1994 | Gesign . |
| 5,139,687 | 8/1992 | Borgher, Sr. et al. . | | 5,324,349 | 6/1994 | Sano et al. . |
| 5,141,556 | 8/1992 | Matrick . | | 5,328,504 | 7/1994 | Ohnishi . |
| 5,141,797 | 8/1992 | Wheeler . | | 5,330,860 | 7/1994 | Grot et al. . |
| 5,144,964 | 9/1992 | Demain . | | 5,334,455 | 8/1994 | Noren et al. . |
| 5,147,901 | 9/1992 | Rutsch et al. . | | 5,338,319 | 8/1994 | Kaschig et al. . |
| 5,153,104 | 10/1992 | Rossman et al. . | | 5,340,631 | 8/1994 | Matsuzawa et al. . |
| 5,153,105 | 10/1992 | Sher et al. . | | 5,340,854 | 8/1994 | Martic et al. . |
| 5,153,166 | 10/1992 | Jain et al. . | | 5,344,483 | 9/1994 | Hinton . |
| 5,160,346 | 11/1992 | Fuso et al. . | | 5,356,464 | 10/1994 | Hickman et al. . |
| 5,160,372 | 11/1992 | Matrick . | | 5,362,592 | 11/1994 | Murofushi et al. . |
| 5,166,041 | 11/1992 | Murofushi et al. . | | 5,368,689 | 11/1994 | Agnemo . |
| 5,169,436 | 12/1992 | Matrick . | | 5,372,387 | 12/1994 | Wajda . |
| 5,169,438 | 12/1992 | Matrick . | | 5,372,917 | 12/1994 | Tsuchida et al. . |
| 5,173,112 | 12/1992 | Matrick et al. . | | 5,374,335 | 12/1994 | Lindgren et al. . |
| 5,176,984 | 1/1993 | Hipps, Sr. et al. . | | 5,376,503 | 12/1994 | Audett et al. . |
| 5,178,420 | 1/1993 | Shelby . | | 5,383,961 | 1/1995 | Bauer et al. . |
| 5,180,425 | 1/1993 | Matrick et al. . | | 5,384,186 | 1/1995 | Trinh . |
| 5,180,652 | 1/1993 | Yamaguchi et al. . | | 5,393,580 | 2/1995 | Ma et al. . |
| 5,181,935 | 1/1993 | Reinert et al. . | | 5,401,303 | 3/1995 | Stoffel et al. . |
| 5,185,236 | 2/1993 | Shiba et al. . | | 5,401,562 | 3/1995 | Akao . |
| 5,187,045 | 2/1993 | Bonham et al. . | | 5,415,686 | 5/1995 | Kurabayashi et al. . |
| 5,187,049 | 2/1993 | Sher et al. . | | 5,415,976 | 5/1995 | Ali . |
| 5,190,565 | 3/1993 | Berenbaum et al. . | | 5,424,407 | 6/1995 | Tanaka et al. . |
| 5,190,710 | 3/1993 | Kletecka . | | 5,425,978 | 6/1995 | Berneth et al. . |
| 5,190,845 | 3/1993 | Hashimoto et al. . | | 5,426,164 | 6/1995 | Babb et al. . |
| 5,193,854 | 3/1993 | Borowski, Jr. et al. . | | 5,427,415 | 6/1995 | Chang . |
| 5,196,295 | 3/1993 | Davis . | | 5,429,628 | 7/1995 | Trinh et al. . |
| 5,197,991 | 3/1993 | Rembold . | | 5,431,720 | 7/1995 | Nagai et al. . |
| 5,198,330 | 3/1993 | Martic et al. . | | 5,432,274 | 7/1995 | Luong et al. . |
| 5,202,209 | 4/1993 | Winnik et al. . | | 5,445,842 | 8/1995 | Tanaka et al. . |
| 5,202,210 | 4/1993 | Matsuoka et al. . | | 5,455,143 | 10/1995 | Zaki . |
| 5,202,211 | 4/1993 | Vercoulen . | | 5,459,014 | 10/1995 | Nishijima et al. . |
| 5,202,212 | 4/1993 | Shin et al. . | | 5,464,472 | 11/1995 | Horn et al. . |
| 5,202,213 | 4/1993 | Nakahara et al. . | | 5,466,283 | 11/1995 | Kondo et al. . |
| 5,202,215 | 4/1993 | Kanakura et al. . | | 5,474,691 | 12/1995 | Severns . |
| 5,202,221 | 4/1993 | Imai et al. . | | 5,475,080 | 12/1995 | Gruber et al. . |
| 5,205,861 | 4/1993 | Matrick . | | 5,476,540 | 12/1995 | Shields et al. . |
| 5,208,136 | 5/1993 | Zanoni et al. . | | 5,479,949 | 1/1996 | Battard et al. . |
| 5,209,814 | 5/1993 | Felten et al. . | | 5,489,503 | 2/1996 | Toan . |
| 5,219,703 | 6/1993 | Bugner et al. . | | 5,498,345 | 3/1996 | Jollenbeck et al. . |
| 5,221,334 | 6/1993 | Ma et al. . | | 5,501,774 | 3/1996 | Burke . |
| 5,224,197 | 6/1993 | Zanoni et al. . | | 5,503,664 | 4/1996 | Sano et al. . |
| 5,224,476 | 7/1993 | Schultz et al. . | | 5,509,957 | 4/1996 | Toan et al. . |
| 5,224,987 | 7/1993 | Matrick . | | 5,532,112 | 7/1996 | Kohler et al. . |
| 5,226,957 | 7/1993 | Wickramanayake et al. . | | | | |
| 5,227,022 | 7/1993 | Leonhardt et al. . | | | | |
| 5,241,059 | 8/1993 | Yoshinaga . | | | | |
| 5,244,476 | 9/1993 | Schulz et al. . | | | | |
| 5,250,109 | 10/1993 | Chan et al. . | | | | |
| 5,254,429 | 10/1993 | Gracia et al. . | | | | |
| 5,258,274 | 11/1993 | Helland et al. . | | | | |
| 5,261,953 | 11/1993 | Vieirira et al. . | | | | |
| 5,262,276 | 11/1993 | Kawamura .................................. 430/281 | | | | |

FOREIGN PATENT DOCUMENTS

| | | |
|---|---|---|
| 552565 | 2/1958 | Canada . |
| 571792 | 3/1959 | Canada . |
| 779239 | 2/1968 | Canada . |
| 930103 | 7/1973 | Canada . |
| 2053094 | 4/1992 | Canada . |
| 94118 | 5/1958 | Czechoslovakia . |
| 0003884 | 9/1979 | European Pat. Off. . |

| | | |
|---|---|---|
| 0127574 | 12/1984 | European Pat. Off. . |
| 0223587 | 5/1987 | European Pat. Off. . |
| 0262533 | 4/1988 | European Pat. Off. . |
| 0280458 | 8/1988 | European Pat. Off. . |
| 0308274 | 3/1989 | European Pat. Off. . |
| 0371304 | 6/1990 | European Pat. Off. . |
| 0373662 | 6/1990 | European Pat. Off. . |
| 0375160 | 6/1990 | European Pat. Off. . |
| 0390439 | 10/1990 | European Pat. Off. . |
| 0458140A1 | 10/1991 | European Pat. Off. . |
| 0458140 | 11/1991 | European Pat. Off. . |
| 0468465 | 1/1992 | European Pat. Off. . |
| 0542286 | 5/1993 | European Pat. Off. . |
| 000571190 | 11/1993 | European Pat. Off. . |
| 1039835 | 9/1958 | Germany . |
| 1047013 | 12/1958 | Germany . |
| 2437380 | 2/1975 | Germany . |
| 2444520 | 3/1975 | Germany . |
| 2714978 | 10/1977 | Germany . |
| 3833437 | 4/1990 | Germany . |
| 3833438 | 4/1990 | Germany . |
| 004036328 | 7/1991 | Germany . |
| 50-65592 | 6/1975 | Japan . |
| 0014233 | 2/1981 | Japan . |
| 56-14569 | 2/1981 | Japan . |
| 56-36556 | 4/1981 | Japan . |
| 57-128283 | 8/1982 | Japan . |
| 59-219270 | 4/1985 | Japan . |
| 60-239739 | 11/1985 | Japan . |
| 60-239740 | 11/1985 | Japan . |
| 60-239741 | 11/1985 | Japan . |
| 60-239743 | 11/1985 | Japan . |
| 61-3781 | 1/1986 | Japan . |
| 62-7703 | 1/1987 | Japan . |
| 62-100557 | 5/1987 | Japan . |
| 62127281 | 6/1987 | Japan . |
| 63-43959 | 2/1988 | Japan . |
| 63-223077 | 9/1988 | Japan . |
| 63-223078 | 9/1988 | Japan . |
| 6429337 | 1/1989 | Japan . |
| 64-40948 | 2/1989 | Japan . |
| 89014948 | 3/1989 | Japan . |
| 1146974 | 6/1989 | Japan . |
| 01210477 | 8/1989 | Japan . |
| 292958 | 4/1990 | Japan . |
| 2179642 | 7/1990 | Japan . |
| 2282261 | 11/1990 | Japan . |
| 03163566 | 7/1991 | Japan . |
| 5134447 | 11/1991 | Japan . |
| 3284668 | 12/1991 | Japan . |
| 4023884 | 1/1992 | Japan . |
| 4023885 | 1/1992 | Japan . |
| 4-136075 | 5/1992 | Japan . |
| 561220 | 3/1993 | Japan . |
| 5-140498 | 6/1993 | Japan . |
| 5263067 | 10/1993 | Japan . |
| 6116555 | 4/1994 | Japan . |
| 6116556 | 4/1994 | Japan . |
| 6116557 | 4/1994 | Japan . |
| 6214339 | 8/1994 | Japan . |
| 6256494 | 9/1994 | Japan . |
| 6256633 | 9/1994 | Japan . |
| 1310767 | 5/1987 | U.S.S.R. . |
| 275245 | 10/1928 | United Kingdom . |
| 349339 | 5/1931 | United Kingdom . |
| 355686 | 8/1931 | United Kingdom . |
| 399753 | 10/1933 | United Kingdom . |
| 441085 | 1/1936 | United Kingdom . |
| 463515 | 4/1937 | United Kingdom . |
| 492711 | 9/1938 | United Kingdom . |
| 518612 | 3/1940 | United Kingdom . |
| 539912 | 9/1941 | United Kingdom . |
| 626727 | 7/1947 | United Kingdom . |
| 600451 | 4/1948 | United Kingdom . |
| 616362 | 1/1949 | United Kingdom . |
| 618616 | 2/1949 | United Kingdom . |
| 779389 | 7/1957 | United Kingdom . |
| 1372884 | 11/1974 | United Kingdom . |
| 2146357 | 4/1985 | United Kingdom . |
| 92/11295 | 7/1992 | WIPO . |
| 93/06597 | 4/1993 | WIPO . |
| 94/01503 | 1/1994 | WIPO . |
| 94/22500 | 10/1994 | WIPO . |
| 94/22501 | 10/1994 | WIPO . |
| 95/04955 | 2/1995 | WIPO . |
| 96/00740 | 1/1996 | WIPO . |
| 96/19502 | 6/1996 | WIPO . |
| 96/22335 | 7/1996 | WIPO . |

OTHER PUBLICATIONS

Patent Abstracts of Japan, JP 5241369 (Bando Chem Ind Lyd et al.), Sep. 21, 1993 (Abstract).

Derwent Publications Ltd., London, JP 05232738 (Yamazaki, T.), Sep. 10, 1993 (Abstract).

Derwent Publications Ltd., London, EP 000559310 (Zeneca Ltd.), Sep. 8, 1993 (Abstract).

Derwent Publications Ltd., London, J.A. 5–230410 (Seiko Epson Corp), Sep. 7, 1993 (Abstract).

Derwent Publications Ltd., London, JP 5–230407 (Mitsubishi Kasei Corp), Sep. 7, 1993 (Abstract).

Abstract Of Patent. JP 405230410 (Seiko Epson Corp.), Sep. 7, 1993 (Abstract).

Abstract Of Patent, JP 405230407 (Mitsubishi Kasei Corp.) Sep. 7, 1993 (Abstract).

5 Patent Abstracts of Japan, JP 5197198 (Bando Chem Ind Ltd et al.), (Abstract).

Database WPI–Derwent Publications Ltd., London, J.A. 5197069 (Bando Chem), Aug. 6, 1993 (Abstract).

Abstract of patent, JP 5–195450 (Nitto Boseki Co. Ltd) Aug. 3, 1993.

Patent Abstracts of Japan, JP5181308 (Bando Chem Ind Ltd et al.), Jul. 23, 1993 (Abstract).

Patent Abstracts of Japan, JP 5181310 (Bando Chem Ind Ltd et al.), Jul. 23, 1993 (Abstract).

Derwent Publications Ltd., London, JP 5–132638 (Mitsubishi Kasei Corp), May 28, 1993 (Abstract).

Abstract Of Patent. JP 405132638 (Mitsubishi Kasei Corp.) May 28, 1993 (Abstract).

Derwent Publications Ltd., London, JP 5–125318 (Mitsubishi Kasei Corp), May 21, 1993 (Abstract).

Abstract Of Patent, JP 405125318 (Mitsubishi Kasei Corp.), May 21, 1993 (Abstract).

Abstract of patent. JP 05–117200 1993.

Derwent Publications Ltd., London, JP 05061246 (Ricoh KK), Mar. 12, 1993 (Abstract).

Husain, N. et al. "Cyclodextrins as mobile–phase additives in reversed–phase HPLC" *American Laboratory* 82 80–87 1993.

Hamilton, D.P. "Tired of Shredding? New Ricoh Method Tries Different Tack" *Wall Street Journal* B2 1993.

"Cyclodextrins: A Breakthrough for Molecular Encapsulation" *American Maize Products Co., (Amaizo)* 1993.

Duxbury "The Photochemistry and Photophysics of Triphenylmethane Dyes in Solid Liquid Media" *Chemical Review* 93 381–433 1993.

Abstract of patent, JP 04–351603 1992.

Abstract of patent, JP 04–351602 1992.

Derwent Publications Ltd., London, JP 404314769 (Citizen Watch CO. Ltd.), Nov. 5, 1992 (Abstract).

Abstract of patent, JP 04315739 1992.

Derwent Publications Ltd., London, JP 04300395 (Funai Denki KK), Oct. 23, 1992 (Abstract).

Derwent Publications Ltd., London, JP 404213374 (Mitsubishi Kasei Corp), Aug. 4, 1992 (Abstract).

Abstract of patent, JP 04–210228 1992.

Abstract Of Patent. JP 404202571 (Canon Inc.), Jul. 23, 1992 (Abstract).

Abstract Of Patent, JP 404202271 (Mitsubishi Kasei Corp.), Jul. 23, 1992 (Abstract).

Derwent Publications Ltd., London, JP 4–189877 (Seiko Epson Corp). Jul. 8, 1992 (Abstract).

Derwent Pubticattons Ltd., London, JP 404189876 (Seiko Epson Corp). Jul. 8, 1992 (Abstract).

Abstract Of Patent, JP 404189877 (Seiko Epson Corp.), Jul. 8, 1992 (Abstract).

Derwent Publications Ltd., London, J.A. 4–170479 (Seiko Epson Corp), Jun. 18, 1992 (Abstract).

Abstract of patent. JP 04–81402 1992.

Abstract of patent, JP 04–81401 1992.

Kogelschatz "Silent–discharge driven excimer UV sources and their applications" *Applicd Surface Science* 410–423 1992.

Derwent Publications. Ltd., London, JP 403269167 (Japan Wool Textile KK). Nov. 29, 1991 (Abstract).

Derwent Publications Ltd., London, JO 3247676 (Canon KK), Nov. 5, 1991 (Abstract).

Abstract of patent. JP 03–220384 1991.

Derwent Publications Ltd., London, JP 3167270 (Mitsubishi Kasei Corp). Jul. 19, 1991 (Abstract).

Derwent Publications Ltd., London, JO 3167270 (Mitsubishi Kasei Corp.). Jul. 19, 1991 (Abstract).

Derwent Publications Ltd., LONDON, JO 3093870 (Dainippon Ink Chem KK.), Apr. 18, 1991 (Abstract).

Abstract of patent, JP 06369890 1991.

Kogelschatz, U. et al. "New Excimer UV Sources for Industrial Applications" *ABB Review* 1–10 1991.

Abstract of patent, JP 03 41165 1991.

"Coloring/Decoloring Agent for Tonor Use Developed" *Japan Chemical Week* 1991.

Braithwaite. M., et al. "Formulation" Chemistry & Technology of IV UV & EB Formulation for Coatings, Inks & Paints 11–12 1991.

Scientific Polymer Products. Inc. Brochure 24–31 1991.

Dietliker, K. "Photoiniators for Free Radical and Catioinc Polymerisation" *Chem & Tech of UV & EB Formulation for Coatings, Ink & Paints* III 280 1991.

Dietliker. K. "Photoiniators for Free Radical and Catioinc Polymerisation" *Chem & Tech of UV & EB Formulation for Coatings, Inks & Paints* III 61, 63, 229–232, 405, 414 1991.

Esrom et al. "Large area Photochemical Dry Etching of Polymers with Incoherent Excimer UV Radiation" *MRS Material Research Society* 1–7 1991.

"New Excimer UV Sources for Industrial Applications" *ABB Review* 391 1–10 1991.

Esrom et al. Excimer Laser–Induced Decompostion of Aluminum Nitride *Materials Research Society Fall Meeting* 1–6 1991.

Esrom et al. "Metal deposition with a Windowless VUV excimer source" *Applied Surface Science* 1–5 1991.

Esrom "Excimer Laser–Induced Surface Activation of Aln for Electroless Metal Deposition" *Mat. Res. Sco.lSymp. Proc.* 204 457–465 1991.

Zhang et al. "UV–induced decompositin of adsorbed Cu–acetylacetonate films at room temperature for electroless metal plating" *Applied Surface Science* 1–6 1991.

"German company develops reuseable paper"0 *Pulp & Paper* 1991.

Abstract of patent, JP 02289652 1990.

Ohashi et al. "Molecular Mechanics Studies on Inclusion Compounds of Cyanine Dye Monomers and Dimers in Cyclodextrin Cavities," *J. Am. Chem. Soc.* 112 5824–5830 1990.

Kogelschatz et al. "New Incoherent Ultraviolet Excimer Sources for Photolytic Material Deposition," *Laser Und Optoelektronik* 1990.

Abstract of Patent, JP 0297957, (Fuji Xerox Co., Ltd.) 1990.

Derwent Publications Ltd., London, JP 2091166 (Canon KK), (Abstract) Mar. 30, 1990.

Esrom et al. "Metal Deposition with Incoherent Excimer Radiation" *Mat. Res. Soc. Symp. Proc.* 158 189–198 1990.

Esrom "UV Excimer Laer–Induced Deposition of Palladium from palladiym Acetate Films" *Mat. Res. Soc. Symp. Proc.* 158 109–117 1990.

Kogelschatz, U. "Silent Discharges for the Generation of ultraviolet and vacuum ultraviolet excimer radiation" *Pure & Applied Chem.* 62 1667–74 1990.

Esrom et al. "Investigation of the mechanism of the UV–induced palladium depostions processf from thin solid palladium acetate films" *Applied Surface Science* 46 158–162 1990.

Zhang et al. "VUV synchrotron radiation processing of than palladium acetate spin–on films for metallic surface patterning" *Applied Surface Science* 46 153–157 1990.

Brennan et al. "Tereoelectronic effects in ring closure reactions: the 2'–hydroyxychalcone–flavanone equilibrium, and related systems," *Canadian J. Chem.* 68(10) pp. 1780–1785– 1990.

Abstract of patent, JP 01299083 1989.

Derwent Publications Ltd., London, J.0. 1182379 (Canon KK), (Abstract) Jul. 20, 1989.

Derwent Publications Ltd., London, JO 1011171 Mitsubishi Chem Ind. KK.), Jan. 13, 1989 (Abstract).

Gruber, R.J., et al. "Xerographic Materials" *Encyclopedia of Polymer Science and Engineering* 17 918–943 1989.

Pappas, S.P. "Photocrosslinking" *Comph. Pol. Sci.* 6 135–148 1989.

Pappas. S.P. "Photoinitiated Polymerization" *Comph. Pol. Sci.* 4 337–355 1989.

Kirilenko. G.V. et al. "An analog of the vesicular process with amplitude modulation of the incident light beam" *Chemical Abstracts* 111 569 [No. 111:12363 3b] 1989.

Esrom et al. "UV excimer laser–induced pre–nucleation of surfaces followed by electroless metallization" *Chemtronics* 4 216–223 1989.

Esrom et al. "VUV light–induced depostion of palladium using an incoherent Xe2* excimer source" *Chemtronics* 4 1989.

Esrom et al. "UV Light–Induced Depostion of Copper Films" C5–719–C5–25 1989.

Falbe et al. *Rompp Chemie Lexikon* 9 270 1989.

Derwent Publications, Ltd., London, SU 1423656 (Kherson Ind Inst), Sep. 15, 1988 (Abstract).

Abstract of patent, JP 6347762, 1988.

Abstract of patent, JP 63 47763, 1988.

Abstract of patent, JP 63–47764, 1988.

Abstract of patertL JP 63–47765, 1988.

Eliasson, B., et al. "UV Excimer Radiation from Dielectric–Barrier Discharges" *Applied Physics B* 46 299–303 1988.

Eliasson et al. "New Trends in High Intensity UV Generation" *EPA Newsletter* (32) 29–40 1988.

Cotton, F.A. "Oxygen: Group Via(16)" *Advanced Inorganic Chemistry* 5th ed. 473–474 1988.

Derwent Publications, Ltd., London, J6 2270665 (Konishiroku Photo KK), Nov. 25, 1987 (Abstract).

Abstract of patent, JP 62215261 1987.

Database WPI. Derwent Publications Ltd., London, JP 62032082 (Mitsubishi Denki KK), (Abstract) Feb. 12, 1987.

Derwent Publications, Ltd., London, EP 0280653 (Ciba GeigyAG), Aug. 31, 1988 (Abstract).

Abstract of patent, JP 63190815 1988.

Furcone, S.Y. et al. "Spin–on B14Sr3Ca3Cu4O16+x superconducting thin films from citrate precursors," *Appl. Phys. Lett.* 52(2 25) 2180–2182 1988.

Abstract of patent. JP 63144329 1988.

Abstract of patent. JP 63130164 1988

Derwent Publications, Ltd., London, J6 3112770 (Toray Ind Inc), May 17, 1988 (Abstract).

Derwent Publications. Ltd., London, J6 3108074 (Konishiroku Photo KK), May 12, 1988 (Abstract).

Derwent Publications, Ltd., London,J6 3108073 (Konishiroku Photo KK), May 12, 1988 (Abstract).

Abstract of patent, JP 6177846 1988.

Abstract of patent, JP 6373241 1988.

Abstract of patent, JP 6232082 1987.

Derwent Publications Ltd., London, J6 2007772 (Alps Electric KK.), Jan. 14, 1987 (Abstract).

Gross et al. "Laser direct–write metallization in thin palladium acetate films" *J. App. Phys.* 61(4) 1628–1632 1987.

Al–Ismaid et al. "Some experimental results on thin polypropylene films loaded with finely–dispersed copper" *Journal of Materials Science* 415–418 1987.

Baufay et al "Optical self–regulation during laser–induced oxidation of copper" *J. Appl. Phys.* 61(9) 4640–4651 1987.

Al–Ismail et al. "Some experimental results on thin polypropylene films loaded with finely–dispersed copper" *Journal of Materials Science* 415–418 1987.

Derwent Publications Ltd., London, JA 02844478 (Sanyo Chem Ind Ltd.), Dec. 15, 1986 (Abstract).

Abstract of patent, JP 61251842 1986.

Database WPI, Derwent Publications Ltd., London, GB; SU, A, 1098210 (Kutulya L A) 23 Jun. 1986.

Abstract of patent, JP 61–97025 1986.

Abstract of patent, JP 61–87760 1986.

Derwent Publications Ltd., London, DL 0234731 (Karl Marx Univ. Leipzig), Apr. 9,1986 (Abstract).

Derwent Publications, Ltd., London, J6 IO41381 (Osaka Prefecture), Feb. 27, 1986 (Abstract).

Sakai et. al. "A Novel and Practical Synthetic Method of 3(2H)–Furanonc Derivatives," *J. Heterocyclie Chem.* 23 pp. 1199–1201 1986.

Jellinek, H.H.G. "Evolution of $H_2O$ and $CO_2$ During the Copper–Catalyzed Oxidation of Isotactic Polypropylene," *J. Polymer Sci.* 24 389–403 1986.

Jellinek, et al. H.H.G. "Diffusion of $Ca_2$ + Catalysts from Cu–Metal Polymer or Cu–Oxide/Polymer Interfaces into Isotactic Polypropylene," *J. Polymer Sci.* 24 503–510 1986.

Derwent Publications Ltd., London, J6 0226575 (Sumitomo Chem Ind Ltd.), Oct. 11, 1985 (Abstract).

Abstract of patent, JP 60156761 1985.

Derwent Publications Ltd., London, J,A. (3011451 (Fugi Photo Film KK), Jan. 21, 1985 (Abstract).

Derwent Publications, Ltd., London J6 0011–449–A (Taoka Chemical KK) Jan. 21, 1985 (abstract).

Roos, G. et al. "Textile applications of photocrosslinkable polymers" *Chemical Abstracts* 103 57 [No. 103:236903j] 1985.

Derwent Publications Ltd., London, JP 0198187 (Canon KK), Nov. 9, 1984 (Abstract).

Derwent Publications Ltd., London, J,A, 0169883 (Ricoh KK), Sep. 25, 1984 (Abstract).

Derwent Publications Ltd., London, JA 0169883 (Ricoh KK), Sep. 25, 1984 (Abstract).

Derwent Publications Ltd., London, JA 0198187 (Canon KK), Sep. 11, 1984 (Abstract).

Derwent Publications Ltd., London, J.A. 0053563 (Dainippon Toryo KK), Mar. 28, 1984 (Abstract).

Derwent Publications Ltd., London, J,A, 0053562 (Dainippon Toryo KK), Mar. 28, 1984 (Abstract).

Abstract of Patent, JA 0053563 (DAinppon Toryo KK), Mar. 28, 1984 (Abstract).

Abstract of Patent, JA 0053562 (Dqinippon Toryo KK), Mar. 28, 1984 (Abstract).

Derwent Publications Ltd., London, J,A, 0051961 (Dainippon Toryo KK), Mar. 26, 1984) (Abstract).

Abstract of Patent, JA 0051961 (Dainippon Toryo KK), Mar. 26, 1984 (Abstract).

Saenger, W. "Structural Aspects of Cyclodextrins and Their Inclusion Complexes" *Inclusion Compounds Structural Aspects of Inclusion Compounds formed by Organic Host* 2 231–259 1984.

Szejtli "Industrial Applications of Cyclodextrins" *Inclusion Compounds: Physical Prop. & Applns* 3 331–390 1984.

Kano et al. "Three–Component Complexes of Cyclodextrins. Exciplex Formation in Cyclodextrin Cavity," *J. Inclusion Phenomena* 2 pp. 737–746 1984.

Suzuki et al. "Spectroscopic Investigation of Cyclodextrin Monomers, Derivatives, Polymers and Azo Dyes," *J. Inclusion Phenomena* 2, pp. 715–724 1984.

Abstract of Patent, JA 22164 (Ricoh KK), Dec. 23, 1983 (Abstract).

Abstract of patent. JP 58211426 (Sekisui Plastics KK), (Dec. 8, 1983).

Derwent Publications, Ltd., London, EP 0072775 (Ciba Geigy AG), Feb. 23, 1983 (Abstract).

van Beek, H.C.A "Light–Induced Colour Changes in Dyes and Materials" *Color Res. and Appl.* 8 176–181 1983.

Connors, K.A. "Application of a stoichiometric model of cyclodextrin complex formation" *Chemical Abstracts* 98 598 [No. 98:53067g] 1983.

Abstract of Patent, EP 0065617 (IBM Corp.), Dec. 1,1982 (Abstract).

Derwent Publications Ltd., London, J.A. 0187289 (Honshu Paper Mfg KK), Nov. 17, 1982 (Abstract).

Abstract of Patent, JA 0187289 (Honsho Paper Mfg KK), Nov. 17, 1982 (Abstract).

Abstract of Patent, JA 0185364 (Ricoh KK), Nov. 15, 1982 (Abstract).

Derwent Publications, Ltd., London J5 7139–146 (Shown Kako KK) Aug. 27, 1982(abstract).

Abstract of Patent, JA 0090069 (Canon KK), Jun. 4, 1982 (Abstract).

Derwent Publications, Ltd., London, JA 0061785 (Nippon Senka KK), Apr. 14, 1982 (Abstract).

Fischer, "Submicroscopic contact imaging with visible light by energy transfer" *Appl. Phys. Letter* 40(3) 1982.

Abstract of Patent, JA 0010659 (Canon KK), Jan. 12, 1982 (Abstract).

Abstract of Patent, JA 0010661 (Canon KK), Jan. 2, 1982 (Abstract).

Christen "Carbonylverbindungen: Aidehyde und Ketone," *Grundlagen der Organischen Chemie* 255 1982.

Derwent Publications Ltd., London, J.A. 0155263 (Canon KK), Dec. 1/1981 (Abstract).

Abstract of Patent, JA 0155263 (Canon KK), Dec. 1, 1981 (Abstract).

Abstract of Patent, JA 0147861 (Canon KK), Nov. 17, 1981 (Abstract).

Derwent Publications Ltd., London, J.A. 0143273 (Canon KK), Nov. 7, 1981 (Abstract).

Abstract of Patent, JA 0143272 (Canon KK), Nov. 7, 1981 (Abstract).

Abstract of Patent, JA 0136861 (Canon KK), Oct. 26, 1981 (Abstract).

Abstract of Patent, JA 6133378 (Canon KK), Oct. 19, 1981 (Abstract).

Abstract of Patent, JA 6133377 (Canon KK), Oct. 19, 1981 (Abstract).

Abstract of Patent, JA 6093775 (Canon KK), Jul. 7, 1981 (Abstract).

Derwent Publications Ltd., London, J.A. 0008135 (Ricoh KK), Jan. 27, 1981 (Abstract).

Derwent Publications Ltd., London, J.A. 0004488 (Canon KK), Jan. 17, 1981 (Abstract).

Abstract of Patent, JA 0004488 (Canon KK), Jan. 17, 1981 (Abstract).

Kirk–Othmer "Metallic Coatings," *Encyclopedia of Chemical Technology* 15 241–274 1981.

Komiyama et al. "One–Pot Preparation of 4–Hydroxychalcone β–Cyclodextrin as Catalyst," *Makromol. Chem.* 2 733–734 1981.

Derwent Publications, Ltd., London CA 1086–7 19 (Sherwood Medical) Sep. 30, 1980 (abstract).

Rosanske et al. "Stoichiometric Model of Cyclodextrin Complex Formation" *Journal of Pharmaceutical Sciences* 69(5) 564–567 1980.

Rosanske et al. "Stoichiometric Model of Cyctodextrin Complex Formation" *Journal of Pharmaceutical Sciences* 69(5) 564–567 1980.

Semple et al. "Synthesis of Functionalized Tetrahydrofurans," *Tetrahedron Letters 81* pp. 4561–4564 1980.

Kirk–Othmer "Film Deposition Techniques," *Encyclopedia of Chemical Technology* 10:247–283 1980.

Derwent World Patents Index, Derwent Info. Ltd., JP 54158941 (Toyo Pulp KK), Dec. 15, 1979 (Abstract).

Derwent Publications Ltd., London, J.A. 0005422 (Fuji Photo Film KK), Jan. 16, 1979 (Abstract).

Drexhage et at. "Photo–bleachable dyes and processes" *Research Disclosure* 85–87 1979.

"Color imaging devices and color filter arrays using photo–bleachable dyes" *Research Disclosure* 22–23 1979.

Wolff, N.E., et al. "Electrophotography" *Kirk–Othmer Encyclopedia of Chemical Technology* 8 794–826 1979.

Derwent Publications Ltd., London, J.A. 0012037 (Pentel KK), Jan. 29, 1977 (Abstract).

Abstract of Patent, JA 0012037 (Pentel KK), Jan. 29, 1977 (Abstract).

Jenkins, P.W. et al. "Photobleachable dye material" *Research Disclosure* 18 [No. 12932] 1975.

Lamberts, R.L. "Recording color grid patterns with lenticules" *Research Disclosure* 18–19 [No. 12923] 1975.

Karmanova, L.S. et al. "Light stabilizers of daytime fluorescent paints" *Chemical Abstracts* 82 147 [No. 59971p] 1975.

Prokopovich, B. et al. "Selection of effective photoinducers for rapid hardening of polyester varnish PE–250"0 *Chemical Abstracts* 83 131 [No. 81334a] 1975.

"Variable Contrast Printing System" *Research Disclosure* 19[No. 12931] 1975.

Lakshman "Electronic Absorption Spectrum of Copper Formate Tetrahydrate" *Chemical Physics Letters* 31 331–334(2) 1975.

Derwent Publications, Ltd., London J4 9131–226 (TNational Cash Register C) Dec. 16, 1974 (abstract).

Chang, LF., et al. "Color Modulated Dye Ink Jet Printer" *IBM Technical Disclosure Bulletin* 17(5 1520–1521) 1974.

"Darocur 1173: Liquid Photoiniator for Ultraviolet Curing of Coatings" 1974.

Hosokawa et al. "Ascofuranone, an antibiotic from Ascohyta," Japan Kokai 73 91,278 (Nov. 28, 1973) *Merck Index* 80 p. 283; abstract 94559t 1974.

Abstract of patent, NL 7112489 (Dec. 27, 1971).

Gafney et al. "Photochemical Reactions of Copper (II)—1, 3–Diketonate Complexes" *Journal of the Americqal Chemical Society* 1971.

Derwent Publications, Ltd., London SU 292698–S Jan. 15, 1971 (abstract).

Rigdon, J.E. "In Search of Paper that Spies Can't Copy" *Wall Street Journal.*

Chatterjee, S. et al. "Photochemistry of Carbocyanine Alkyltriphenylborate Salts: Intra–Ion–Pair Electron Transfer and the Chemistry of Boranyl Radicals" *J. Am. Chem. Soc.* 112 6329–6338.

"Assay–Physical and Chemical Analysis of Complexes" *AMAIZO.*

"Cyclodextrin" *AMAIZO.*

"Beta Cyclodextrin Polymer (BCDP)" *AMIZO.*

"Chemically Modified Cyclodextrins" *AMAIZO.*

"Cyclodextrin Cpmplexation" *American Maize Products Co..*

"Monomers" *Scientific Polymer Products Inc..*

Suppan, Paul "Quenching of Exciting States" *Chemistry and Light* 65–69.

Yamaguchi, H. et al. "Supersensitization. Aromatic ketones as supersensitizers" *Chemical Abstracts* 53 107 (d).

Stecher, H. "Ultraviolet–absorptive additives in adhesives, lacquers and plastics" *Chemical Abstracts* 53 14579 (c).

Maslennikov, A.S. "Coupling of diazonium salts with ketones" *Chemical Abstracts* 60 3128e.

Derwent Publications Ltd., London, 4 9128022.

Abstracts of Patent, JP 405195450.

Rose, Philip I. "Gelatin" *Encyclopedia of Chemical Technology* 7 488–513.

ADHESIVE COMPOSITION CURABLE UPON EXPOSURE TO RADIATION AND APPLICATIONS THEREFOR

CROSS-REFERENCE TO RELATED APPLICATION

This application is a division of application Ser. No. 08/327,077, filed Oct. 21, 1994 now abandoned, and a continuation-in-part application of U.S. Ser. No. 08/268,685, filed on Jun. 30, 1994, now abandoned.

BACKGROUND OF THE INVENTION

The present invention relates to a method of generating a reactive species. The present invention also relates to radiation-initiated polymerization and curing processes. For convenience, much of the discussion which follows centers on free radicals as a particularly significant reactive species. Such discussion, however, is not to be construed as limiting either the spirit or scope of the present invention.

Polymers long have served essential needs in society. For many years, these needs were filled by natural polymers. More recently, synthetic polymers have played an increasingly greater role, particularly since the beginning of the 20th century. Especially useful polymers are those prepared by an addition polymerization mechanism, i.e., free radical chain polymerization of unsaturated monomers, and include, by way of example only, coatings and adhesives. In fact, the majority of commercially significant processes is based on free-radical chemistry. That is, chain polymerization is initiated by a reactive species which often is a free radical. The source of the free radicals is termed an initiator or photoinitiator.

Improvements in free radical chain polymerization have focused both on the polymer being produced and the photoinitiator. Whether a particular unsaturated monomer can be converted to a polymer requires structural, thermodynamic, and kinetic feasibility. Even when all three exist, kinetic feasibility is achieved in many cases only with a specific type of photoinitiator. Moreover, the photoinitiator can have a significant effect on reaction rate which, in turn, may determine the commercial success or failure of a particular polymerization process or product.

A free radical-generating photoinitiator may generate free radicals in several different ways. For example, the thermal, homolytic dissociation of an initiator typically directly yields two free radicals per initiator molecule. A photoinitiator, i.e., an initiator which absorbs light energy, may produce free radicals by either of two pathways:

(1) the photoinitiator undergoes excitation by energy absorption with subsequent decomposition into one or more radicals; or (2) the photoinitiator undergoes excitation and the excited species interacts with a second compound (by either energy transfer or a redox reaction) to form free radicals from the latter and/or former compound(s).

While any free radical chain polymerization process should avoid the presence of species which may prematurely terminate the polymerization reaction, prior photoinitiators present special problems. For example, absorption of the light by the reaction medium may limit the amount of energy available for absorption by the photoinitiator. Also, the often competitive and complex kinetics involved may have an adverse effect on the reaction rate. Moreover, commercially available radiation sources, such as medium and high pressure mercury and xenon lamps, emit over a wide wavelength range, thus producing individual emission bands of relatively low intensity. Most photoinitiators only absorb over a small portion of the emission spectra and, as a consequence, most of the lamps' radiation remains unused. In addition, most known photoinitiators have only moderate quantum yields (generally less than 0.4) at these wavelengths, indicating that the conversion of light radiation to radical formation could be more efficient. Thus, there are continuing opportunities for improvements in free radical polymerization photoinitiators.

SUMMARY OF THE INVENTION

The present invention addresses some of the difficulties and problems discussed above by the discovery of an efficient method for utilizing radiation. Hence, the present invention comprehends a method of generating a reactive species which includes providing a wavelength-specific sensitizer in association with a reactive species-generating photoinitiator and irradiating the wavelength-specific sensitizer. Such method involves effectively tuning the energy-absorbing entity, referred to herein as a polymolecular photoreactor, to efficiently utilize an emitted band of radiation. The wavelength-specific sensitizer effectively absorbs photons and efficiently transfers the absorbed energy to the photoinitiator which, in turn, generates a reactive species. The wavelength-specific sensitizer is adapted to have an absorption peak generally corresponding to a maximum emission band of the radiation source.

The association of a wavelength-specific sensitizer with a reactive species-generating photoinitiator results in a structure referred to herein for convenience as a polymolecular photoreactor. Thus, the method of the present invention may be described as a method of generating a reactive species which involves exposing a polymolecular photoreactor to radiation, in which the polymolecular photoreactor includes a wavelength-specific sensitizer associated with a reactive species-generating photoinitiator The radiation to which the polymolecular photoreactor is exposed generally will have a wavelength of from about 4 to about 1,000 nanometers. Thus, the radiation may be ultraviolet radiation, including near ultraviolet and far or vacuum ultraviolet radiation, visible radiation, and near infrared radiation. Desirably, the radiation will have a wavelength of from about 100 to about 900 nanometers. More desirably, the radiation will be ultraviolet radiation, e.g., ultraviolet radiation having a wavelength of from about 100 to about 375 nanometers. The radiation desirably will be incoherent, pulsed ultraviolet radiation from a dielectric barrier discharge excimer lamp.

In its simplest form, the polymolecular photoreactor consists of a single wavelength-specific sensitizer associated with a single reactive species-generating photoinitiator. In this instance, the photoreactor will be a bimolecular photoreactor. However, the photoreactor may include more than one wavelength-specific sensitizer and/or more than one reactive species-generating photoinitiator. When the polymolecular photoreactor is a bimolecular or trimolecular photoreactor and the radiation to which it will be exposed is ultraviolet radiation, the bimolecular or trimolecular photoreactor desirably will contain a benzoyl moiety and a moiety which is either a phthalic acid derivative or a phenyl-substituted aliphatic ketone derivative.

The present invention also comprehends a method of polymerizing an unsaturated monomer by exposing the unsaturated monomer to radiation in the presence of the efficacious polymolecular photoreactor described above.

When an unsaturated oligomer/monomer mixture is employed in place of the unsaturated monomer, curing is accomplished.

DETAILED DESCRIPTION OF THE INVENTION

Figure 1:
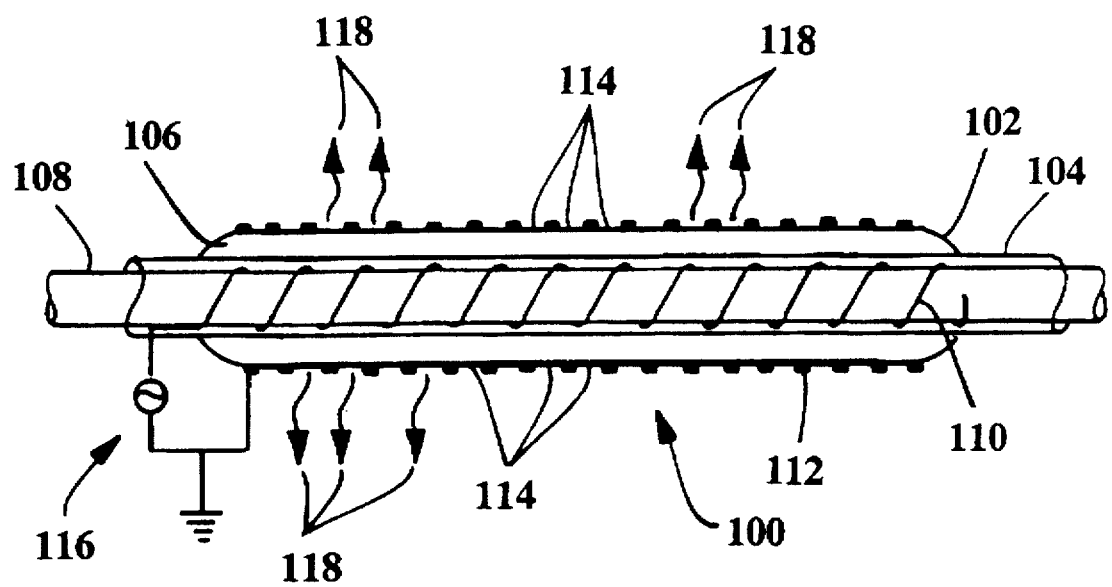
FIG. 1 is a diagrammatic representation of the excimer lamp employed in the examples.

The term "polymerization" is used herein to mean the combining, e.g. covalent bonding, of large numbers of smaller molecules, such as monomers, to form very large molecules, i.e., macromolecules or polymers. The monomers may be combined to form only linear macromolecules or they may be combined to form three-dimensional macromolecules, commonly referred to as crosslinked polymers.

As used herein, the term "curing" means the polymerization of functional oligomers and monomers, or even polymers, into a crosslinked polymer network. Thus, curing is the polymerization of unsaturated monomers or oligomers in the presence of crosslinking agents.

The terms "unsaturated monomer," "functional oligomer," and "crosslinking agent" are used herein with their usual meanings and are well understood by those having ordinary skill in the art. The singular form of each is intended to include both the singular and the plural, i.e., one or more of each respective material.

The term "unsaturated polymerizable material" is meant to include any unsaturated material capable of undergoing polymerization. The term encompasses unsaturated monomers, oligomers, and crosslinking agents. Again, the singular form of the term is intended to include both the singular and the plural.

The term "wavelength-specific sensitizer" is used herein to mean that the sensitizer is adapted to have an absorption wavelength band generally corresponding to an emission peak of the radiation. Either or both of the sensitizer and the radiation may have more than one absorption wavelength band and emission peak, respectively. In the event both the sensitizer and the radiation have more than one absorption wavelength band and emission peak, respectively, the general correspondence just described need not be limited to a single absorption wavelength band and a single emission peak.

The term "quantum yield" is used herein to indicate the efficiency of a photochemical process. More particularly quantum yield is a measure of the probability that a particular molecule will absorb a quantum of light during its interaction with a photon. The term expresses the number of photochemical events per photon absorbed. Thus, quantum yields may vary from zero (no absorption) to 1.

The term "reactive species" is used herein to mean any chemically reactive species including, but not limited to, free-radicals, cations, anions, nitrenes, and carbenes.

The term "associated" as used herein is meant to include any means which results in the wavelength-specific sensitizer and the reactive species-generating photoinitiator being in sufficiently close proximity to each other to permit the transfer of energy absorbed by the sensitizer to the photoinitiator. For example, the wavelength-specific sensitizer and the reactive species-generating photoinitiator may be bonded to each other or to a spacer molecule as described hereinafter by covalent, hydrogen, van der Waals, or ionic bonds. Alternatively, the sensitizer and the photoinitiator may be physically admixed.

The method of the present invention involves generating a reactive species by exposing a polymolecular photoreactor to radiation in which the polymolecular photoreactor includes a wavelength-specific sensitizer associated with a reactive species-generating photoinitiator. In other words, the method involves providing a wavelength-specific sensitizer in association with a reactive species-generating photoinitiator and irradiating the wavelength-specific sensitizer. The sensitizer absorbs photons having a specific wavelength and transfers the absorbed energy to the photoinitiator which, in turn, generates a reactive species. However, the efficiency with which a reactive species is generated is significantly greater than that experienced with the reactive species-generating photoinitiator alone. For example, the polymolecular photoreactor desirably will have a quantum yield greater than about 0.5. More desirably, the quantum yield of the polymolecular photoreactor will be greater than about 0.6. Even more desirably, the quantum yield of the polymolecular photoreactor will be greater than about 0.7. Still more desirably, the quantum yield of the polymolecular photoreactor will be greater than about 0.8, with the most desirable quantum yield being greater than about 0.9.

As stated above, the polymolecular photoreactor of the present invention includes a wavelength-specific sensitizer in association with a reactive species-generating photoinitiator. Any wavelength-specific sensitizer known to those having ordinary skill in the art may be used in the present invention. Similarly, any reactive species-generating photoinitiator may be used which generates the desired reactive species. Examples of reactive species include, but are not limited to, free radicals, carbenes, nitrenes, cations, and anions. Illustrated below are examples of several of such species.

With regard to the free radical-generating photoinitiators, these photoinitiators may be any of the photoinitiators known to those having ordinary skill in the art. The largest group of photoinitiators are carbonyl compounds, such as ketones, especially a-aromatic ketones. Examples of α-aromatic ketone photoinitiators include, by way of illustration only, benzophenones; xanthones and thioxanthones; α-ketocoumarins; benzils; α-alkoxydeoxybenzoins; benzil ketals or α,α-dialkoxydeoxybenzoins; benzoyldialkylphosphonates; acetophenones, such as α-hydroxycyclohexyl phenyl ketone, α,α-dimethyl-α-hydroxyacetophenone, α,α-dimethyl-α-morpholino-4-methylthioacetophenone, α-ethyl-α-benzyl-α-dimethylaminoacetophenone, α-ethyl-α-benzyl-α-dimethylamino-4-morpholinoacetophenone, α-ethyl-α-benzyl-α-dimethylamino-3,4-dimethoxyacetophenone, α-ethyl-α-benzyl-α-dimethylamino-4-methoxyacetophenone, α-ethyl-α-benzyl-α-dimethylamino-4-dimethylaminoacetophenone, α-ethyl-α-benzyl-α-dimethylamino-4-methylacetophenone, α-ethyl-α-(2-propenyl)-α-dimethylamino-4-morpholinoacetophenone, α,α-bis(2-propenyl)-α-dimethylamino-4-morpholinoacetophenone, α-methyl-α-benzyl-α-dimethylamino-4-morpholinoacetophenone, and α-methyl-α-(2-propenyl)-α-dimethylamino-4-morpholinoacetophenone; α,α-dialkoxyacetophenones; α-hydroxyalkylphenones; O-acyl α-oximino ketones; acylphosphine oxides; fluorenones, such as fluorenone, 2-t-butylperoxycarbonyl-9-fluorenone, 4-t-butylperoxycarbonyl-nitro-9-fluorenone, and 2,7-di-t-butylperoxycarbonyl-9-fluorenone; and α- and β-naphthyl carbonyl compounds. Other free radical-generating photoinitiators include, by way of illustration, triarylsilyl peroxides, such as triarylsilyl t-butyl peroxides; acylsilanes; and some organometallic compounds. The free radical-generating initiator desirably will be an acetophenone.

Examples of carbenes include, for example, methylene or carbene, dichlorocarbene, diphenylcarbene, alkylcarbonylcarbenes, siloxyearbenes, and dicarbenes. Examples of nitrenes include, also by way of example, nitrene, alkyl nitrenes, and aryl nitrenes. Cations (sometimes referred to as carbocations or carbonium ions) include, by way of illustration, primary, secondary, and tertiary alkyl carbocations, such as methyl cation, ethyl cation, propyl cation, t-butyl cation, t-pentyl cation, t-hexyl cation; allylic cations; benzylic cations; aryl cations, such as triphenyl cation; cyclopropylmethyl cations; methoxymethyl cation; triarylsulphonium cations; and acyl cations. Cations also include those formed from various metal salts, such as tetra-n-butylammonium tetrahaloaurate(III) salts; sodium tetrachloroaurate(III); vanadium tetrachloride; and silver, copper(I) and (II), and thallium(I) triflates. Examples of anions (sometimes referred to as carbanions) include, by way of example, alkyl anions, such as ethyl anion, n-propyl anion, isobutyl anion, and neopentyl anion; cycloalkyl anions, such as cyclopropyl anion, cyclobutyl anion, and cyclopentyl anion; allylic anions; benzylic anions; aryl cations; and sulfur- or phosphorus-containing alkyl anions. Finally, examples of organometallic photoinitiators include titanocenes, fluorinated diaryltitanocenes, iron arene complexes, manganese decacarbonyl, and methylcyclopentadienyl manganese tricarbonyl. Organometallic photoinitiators generally produce free radicals or cations.

The types of reactions that various reactive species enter into include, but are not limited to, addition reactions, including polymerization reactions; abstraction reactions; rearrangement reactions; elimination reactions, including decarboxylation reactions; oxidation-reduction (redox) reactions; substitution reactions; and conjugation/deconjugation reactions.

The other component of the polymolecular photoreactor is a wavelength-specific sensitizer. Such sensitizer generally may be any compound which, when associated with the reactive species-generating photoinitiator, absorbs photons having a specific wavelength and transfers the absorbed energy to the photoinitiator. As a practical matter, two classes of compounds are known to be useful as wavelength-specific sensitizers, namely, phthalic acid derivatives and phenyl-substituted aliphatic ketones. A particularly useful example of each class is phthaloylglycine and 4-(4-hydroxyphenyl)butan-2-one, respectively.

As stated above, the polymolecular photoreactor of the present invention is comprised of a wavelength-specific sensitizer in association with a reactive species-generating photoinitiator. The sensitizer may be in a simple mixture with the photoinitiator, or it may be bonded to the photoinitiator. For example, the sensitizer may be bonded to the photoinitiator by covalent, hydrogen, van der Waa's, or ionic bonds. Desirably, the sensitizer is covalently bonded to the photoinitiator.

As noted earlier, the wavelength-specific sensitizer is adapted to have an absorption wavelength band generally corresponding to an emission peak of the radiation. In addition, the wavelength-specific sensitizer will have a high intensity of absorption. For example, the wavelength-specific sensitizer may have a molar extinction coefficient greater than about 5,000 liters per mole per cm (1mole$^{-1}$cm$^{-1}$) at an absorption maximum. As another example, the wavelength-specific sensitizer may have a molar extinction coefficient (absorptivity) greater than about 10,000 1mole$^{-1}$cm$^{-1}$. As a further example, the wavelength-specific sensitizer will have a molar extinction coefficient greater than about 20,000 1mole$^{-1}$cm$^{-1}$.

The absorption characteristics of the wavelength-specific sensitizer are not limited to a single wavelength band. Many compounds exhibit more than one absorption wavelength band. Consequently, a wavelength-specific sensitizer may be adapted to absorb two or more wavelength bands of radiation. Alternatively, two or more wavelength-specific sensitizers may be associated with a reactive species-generating photoinitiator. Such two or more wavelength-specific sensitizers may absorb the same wavelength band or they may absorb two or more different wavelength bands of radiation.

In the embodiment where the wavelength-specific sensitizer is bound to the reactive species-generating photoinitiator, any suitable method that is known in the art may be used to bond the sensitizer to the photoinitiator. The choice of such method will depend on the functional groups present in the sensitizer and photoinitiator and is readily made by those having ordinary skill in the art. Such bonding may be accomplished by means of functional groups already present in the molecules to be bonded, by convening one or more functional groups to other functional groups, or through one or more spacer molecules. The term "spacer molecule" is used herein to mean any molecule which aids in the bonding process. For example, a spacer molecule may assist in the bonding reaction by relieving steric hindrance. Alternatively, a spacer molecule may allow use of more reactive or more appropriate functional groups, depending upon the functional groups present in the sensitizer and photoinitiator. It is contemplated that a spacer molecule may aid in the transfer of energy from the sensitizer to the photoinitiator, by either allowing a more favorable conformation or providing a more favorable energy transfer pathway.

Exposing the polymolecular photoreactor to radiation results in the generation of a reactive species. Thus, the polymolecular photoreactor may be employed in any situation where reactive species are required, such as for the polymerization of an unsaturated monomer and the curing of an unsaturated oligomer/monomer mixture. The unsaturated monomers and oligomers may be any of those known to one having ordinary skill in the art. In addition, the polymerization and curing media also may contain other materials as desired, such as pigments, extenders, amine synergists, and such other additives as are well known to those having ordinary skill in the art.

By way of illustration only, examples of unsaturated monomers and oligomers include ethylene: propylene: vinyl chloride: isobutylene: styrene: isoprene: acrylonitrile: acrylic acid: methacylic acid: ethyl acrylate: methyl methacrylate: vinyl acrylate: allyl methacrylate: tripropylene glycol diacrylate: trimethylol propane ethoxylate acrylate: epoxy acrylates, such as the reaction product of a bisphenol A epoxide with acrylic acid; polyester acrylates, such as the reaction product of acrylic acid with an adipic acid/hexanediol-based polyester: urethane acrylates, such as the reaction product of hydroxypropyl acrylate with diphenylmethane-4,4'-diisocyanate: and polybutadiene diacrylate oligomer.

As already noted, the radiation to which the polymolecular photoreactor is exposed generally will have a wavelength of from about 4 to about 1,000 nanometers. Thus, the radiation may be ultraviolet radiation, including near ultraviolet and far or vacuum ultraviolet radiation; visible radiation; and near infrared radiation. Desirably, the radiation will have a wavelength of from about 100 to about 900 nanometers. More desirably, the radiation will have a wavelength of from about 100 to 700 nanometers.

Desirably, when the reactive species-generating photoinitiator is an organic compound, the radiation will be ultraviolet radiation having a wavelength of from about 4 to about 400 nanometers. More desirably, the radiation will have a wavelength of from about 100 to about 375 nanometers, and even more desirably will have a wavelength of from 200 to about 370 nanometers. For example, the radiation may have a wavelength of from about 222 to about 308 nanometers. The radiation desirably will be incoherent, pulsed ultraviolet radiation from a dielectric barrier discharge excimer lamp.

When the wavelength-specific sensitizer is an organometallic compound, the radiation desirably will have a wavelength of from about 4 to about 1,000 nanometers. More desirably, the radiation will have a wavelength of from about 700 to about 900 nanometers. Even more desirably, the radiation will have a wavelength of from about 785 to about 825 nanometers. Most desirably, the radiation will have a wavelength of approximately 800 nanometers.

Dielectric barrier discharge excimer lamps (also referred to hereinafter as "excimer lamp") are described, for example, by U. Kogelschatz, "Silent discharges for the generation of ultraviolet and vacuum ultraviolet excimer radiation." Pure & Appl. Chem., 62, No. 9, pp. 1667–1674 (1990); and E. Eliasson and U. Kogelschatz, "UV Excimer Radiation from Dielectric- Barrier Discharges." Appl. Phys. B. 46, pp. 299–303 (1988). Excimer lamps were developed by ABB Infocom Ltd., Lenzburg, Switzerland, and at the present time are available from Heraeus Noblelight GmbH, Kleinostheim, Germany.

The excimer lamp emits incoherent, pulsed ultraviolet radiation. Such radiation has a relatively narrow bandwidth, i.e., the half width is of the order of approximately 5 to 100 nanometers. Desirably, the radiation will have a half width of the order of approximately 5 to 50 nanometers, and more desirably will have a half width of the order of 5 to 25 nanometers. Most desirably, the half width will be of the order of approximately 5 to 15 nanometers.

The ultraviolet radiation emitted from an excimer lamp can be emitted in a plurality of wavelengths, wherein one or more of the wavelengths within the band are emitted at a maximum intensity. Accordingly, a plot of the wavelengths in the band against the intensity for each wavelength in the band produces a bell curve. The "half width" of the range of ultraviolet radiation emitted by an excimer lamp is defined as the width of the bell curve at 50% of the maximum height of the bell curve.

The emitted radiation of an excimer lamp is incoherent and pulsed, the frequency of the pulses being dependent upon the frequency of the alternating current power supply which typically is in the range of from about 20 to about 300 kHz. An excimer lamp typically is identified or referred to by the wavelength at which the maximum intensity of the radiation occurs, which convention is followed throughout this specification and the claims. Thus, in comparison with most other commercially useful sources of ultraviolet radiation which typically emit over the entire ultraviolet spectrum and even into the visible region, excimer lamp radiation is essentially monochromatic.

Excimers are unstable excited-state molecular complexes which occur only under extreme conditions, such as those temporarily existing in special types of gas discharge. Typical examples are the molecular bonds between two rare gaseous atoms or between a rare gas atom and a halogen atom. Excimer complexes dissociate within less than a microsecond and, while they are dissociating, release their binding energy in the form of ultraviolet radiation. The dielectric barrier excimers in general emit in the range of from about 125 nm to about 500 nm, depending upon the excimer gas mixture.

The present invention is further described by the examples which follow. Such examples, however, are not to be construed as limiting in any way either the spirit or the scope of the present invention. In the examples, all parts are by weight, unless stated otherwise.

EXAMPLE 1

This example describes the preparation of the bimolecular photoreactor, 2-[p-(2-methyllactoyl)phenoxy]ethyl 1,3-dioxo-2-isoindolineacetate.

A 250 ml, three-necked, round-bottomed flask was fitted with a Dean and Stark apparatus with condenser and two glass stoppers. The flask was charged with 20.5 g (0.1 mole) of phthaloylglycine (Aldrich Chemical Company, Milwaukee. Wis., 24.6 g (0.1 mole) of Darcur®2959 ($\alpha,\alpha$-dimethyl-$\alpha$-hydroxy-4-(2-hydroxyethoxy)acetophenone, Ciba-Geigy Corporation, Hawthorne, N.Y.), 100 ml of benzene (Aldrich), and 0.4 g of p-toluenesulfonic acid (Aldrich). The resulting mixture was heated at reflux temperature for three hours, after which time 1.8 ml (0.1 mole) of water was collected in the Dean and Stark apparatus. The solvent was removed to give 43.1 g of white powder. The powder was recrystallized from 30 volume percent ethyl acetate in hexane (Fisher Scientific, Pittsburgh, Pa.) to give 40.2 g (93 percent yield) of a white crystalline powder having a melting point of 153–4° C.

The expected structure was verified by infrared and nuclear magnetic resonance analyses. The infrared spectrum of the powder was obtained as a Nujol mull and showed absorption maxima at 3440, 1760, 1680, and 1600 cm$^{-1}$. The nuclear magnetic resonance data for the powder were as follows:

$^1$H NMR (CDCl$_3$): 1.64 (s), 4.25 (m), 4.49 (m), 6.92 (m), 7.25 (m), 7.86 (m), 7.98 (m), 8.06 (m) ppm.

EXAMPLE 2

This example describes the preparation of the bimolecular photoreactor, 2-hydroxy-2-methyl-4'-[2-[p-(3-oxobutyl)phenoxy]ethoxy]propiophenone. The preparation was carried out in two steps.

A 100-ml round-bottomed flask was charged with 24.6 g (0.1 mole) of Darcur® 2959, 20 ml of toluene (Aldrich), 11.9 g (0.1 mole) of thionyl chloride (Aldrich), and 0.5 ml of pyridine (Aldrich). The flask was fitted with a condenser and the reaction mixture was heated at reflux temperature for two hours. The solvent was removed by distillation at reduced pressure (0.1 Torr) to yield a colorless solid which was used without purification.

To a 250-ml, three-necked, round-bottomed flask fitted with a condenser and a magnetic stirring bar was added 17.6 g (0.1 mole) of 4-(4-hydroxyphenyl)-butan-2-one (Aldrich), the chloro-substituted Darcur® 2959 ($\alpha,\alpha$-dimethyl-$\alpha$- hydroxy-4-(2-chloroethoxy)acetophenone) prepared as described above, 1.0 ml of pyridine, and 100 ml of anhydrous tetrahydrofuran (Aldrich). The mixture was heated at reflux temperature for three hours and the solvent then was partially (about 60 volume percent) removed under reduced pressure. The remaining mixture was poured into ice water and extracted with two 50-ml aliquots of diethyl ether (Aldrich). The ether extracts were combined and dried over anhydrous magnesium sulfate. Removal of the solvent left 39.1 g of a white solid. Recrystallization of the solid as described in Example 1 gave 36.7 g (91 percent yield) of a white crystalline powder having a melting point of 142°–3° C.

The expected structure was verified by infrared and nuclear magnetic resonance analyses. The infrared spectrum of the powder was obtained as a Nujol mull and showed absorption maxima at 3460, 1740, 1700, 1620, and 1600 $cm^{-1}$. The nuclear magnetic resonance data for the powder were as follows:

$^1$H NMR ($CDCl_3$): 1.62 (s), 4.2 (m), 4.5 (m), 6.9 (m) ppm.

EXAMPLE 3

This example describes the preparation of the bimolecular photoreactor, [p-[(4-benzoylcyclohexyl)oxy]phenyl]-2-butanone.

To a 250-ml, two-necked, round-bottomed flask fitted with a condenser and a stopper was added 20.4 g (0.1 mole) of Irgacure® 184 (Ciba-Geigy) and 100 ml of anhydrous tetrahydrofuran. The mixture was stirred and cooled to ice/salt bath temperature while flushing the flask with argon. To the resulting solution was added slowly 20.0 g (0.15 mole) of aluminum chloride (Aldrich) over a 40 minute period. The resulting mixture was stirred an additional 20 minutes. To the mixture then was added 17.6 g (0.1 mole) of 4-(4-hydroxyphenyl)butan-2-one. The new mixture was stirred overnight while being allowed to warm to ambient temperature. The reaction mixture then was poured into ice water and extracted with three 50-ml portions of diethyl ether. Removal of the ether gave 34.1 g of a white solid. Recrystallization of the solid from 10 volume percent ethyl acetate in hexane gave 30.2 g (83 percent) of a white crystalline powder having a melting point of 136°–8° C.

The expected structure was verified by infrared and nuclear magnetic resonance analyses. The infrared spectrum of the powder was obtained as a Nujol mull and showed absorption maxima at 1760, 1740, 1620, and 1600 $cm^{-1}$. The nuclear magnetic resonance data for the powder were as follows:

$^1$H NMR ($CDCl_3$): 2.10 (s), 2.70 (m), 6.80 (m), 6.92 (m), 8.42 (m) ppm.

EXAMPLE 4

This example describes the preparation of the trimolecular photoreactor, 1,3-dioxo-2-isoindolineacetic acid, diester with 2-hydroxy-4'-(2-hydroxyethoxy)-2-methylpropiophenone.

A 250-ml, two-necked, round-bottomed flask was fitted with a condenser and a Dean and Stark apparatus. The flask was charged with 41.0 g (0.2 mole) of phthaloylglycine, 24.6 g (0.1 mole) of Darcur® 2959, 100 ml of benzene, and 3 ml of concentrated sulfuric acid (Fisher). The mixture was heated at reflux temperature for three hours, after which time 3.6 ml (0.2 mole) of water had been collected in the Dean and Stark apparatus. The solvent was removed from the reaction mixture to give 61.8 g of a solid. The material was recrystallized as described in Example 1 to give 57.6 g (93 percent) of product having a melting point of 168°–9° C.

The expected structure was verified by infrared and nuclear magnetic resonance analyses. The infrared spectrum of the powder was obtained as a Nujol mull and showed absorption maxima at 1760, 1740, 1620, and 1600 $cm^{-1}$. The nuclear magnetic resonance data for the powder were as follows:

$^1$H NMR ($CDCl_3$): 1.64 (s), 4.25 (m), 4.49 (m), 6.91 (m), 7.30 (m), 7.84 (m), 7.98 (m), 8.06 (m) ppm.

EXAMPLE 5

This example describes the evaluation of the curing behavior of adhesives containing the polymolecular photoreactors of Examples 1–4, inclusive, upon exposure to ultraviolet radiation from an excimer lamp.

An excimer lamp configured substantially as described by Kozelschatz and Eliasson et al., supra, was employed and is shown diagrammatically in FIG. 1. With reference to FIG. 1, the excimer lamp 100 consisted of three coaxial quartz cylinders and two coaxial electrodes. The outer coaxial quartz cylinder 102 was fused at the ends thereof to a central coaxial quartz cylinder 104 to form an annular discharge space 106. An excimer-forming gas mixture was enclosed in the annular discharge space 106. An inner coaxial quartz cylinder 108 was placed within the central cylinder 104. The inner coaxial electrode 110 consisted of a wire wound around the inner cylinder 108. The outer coaxial electrode 112 consisted of a wire mesh having a plurality of openings 114. The inner coaxial electrode 110 and outer coaxial electrode 112 were connected to a high voltage generator 116. Electrical discharge was maintained by applying an alternating high voltage to the coaxial electrodes 110 and 112. The operating frequency was 40 kHz, the operating voltage 10 kV. Cooling water was passed through the inner coaxial quartz cylinder 108, thereby maintaining the temperature at the outer surface of the lamp at less than about 120° C. The resulting ultraviolet radiation was emitted through the openings 114 as shown by lines 118. The lamp was used as an assembly of four lamps 100 mounted side-by-side in a parallel arrangement.

A standard adhesive mixture was prepared by mixing 90 parts by weight of Genomer®D1500B Difunctional Polyester Urethane Acrylate (Mader, Biddie Sawyer Corporation, New York, N.Y.) and 9 parts of pentaerythritol triacrylate (Polysciences, Inc., Warrington, Pa.). The mixture was stirred by means of a magnetic stirring bar for 20 minutes at 80° C.

To aliquots of the standard adhesive mixture were added the compounds of Examples 1–4, respectively. Two control mixtures were prepared using commercially available photoinitiators, Irgacure® 907 (α,α-dimethyl-α-morpholino-4-methylthiophenylacetophenone or 2-methyl-1-[4-(methylthio)phenyl]-2-morpholinopropanone-1, Ciba-Geigy) as Control A, and Darcur® 2959 as Control B. In each case, the amount of photoinitiator or photoreactor added was 1 part. Each resulting mixture was stirred thoroughly. A few drops of each mixture were placed on a metal plate (Q-Panel Company, Cleveland, Ohio) and drawn down to a film having a thickness of about 0.6 mil (about 0.015 mm) by means of a draw-down bar (Industry Tech., Oldsmar, Fla.). Each film then was exposed to 222 nanometer (nm) ultraviolet radiation emitted by a KrCl* excimer lamp for a period of time sufficient to cure the film (through-cure time).

A film of adhesive was deemed cured completely, i.e., through the entire thickness of the film, when it passed the scratch test; see, e.g., M. Braithwaite et al., "Chemistry & Technology of UV & EB Formulation for Coatings, Inks & Paints," Vol. IV, SITA Technology Ltd., London, 1991, pp.11–12. The results are summarized in Table 1.

TABLE 1

Summary of Through-Cure Times With Constant Photoreactor Concentration

| Photoreactor | Through-Cure Time (Sec.) |
|---|---|
| Control A | 15.0 |
| Control B | 12.4 |
| Example 1 | 2.0 |
| Example 2 | 3.2 |
| Example 3 | 4.6 |
| Example 4 | 2.2 |

EXAMPLE 6

The procedure of Example 5 was repeated with varying concentrations of photoreactor. The amount of pentaerythritol triacrylate was decreased as required to provide 100 parts of control photoinitiator- or photoreactor-containing adhesive. The results are summarized in Table 2 (the data for a control photoinitiator or photoreactor concentration of 1 percent are from Example 1).

TABLE 2

Summary of Through-Cure Times With Varying Photoreactor Concentrations

| Photoreactor | Through-Cure Time (Sec.) | | | |
|---|---|---|---|---|
| | 1 Percent | 2 Percent | 3 Percent | 4 Percent |
| Control A | 15.0 | 11.0 | 8.0 | 5.0 |
| Control B | 12.4 | 7.4 | 5.8 | 4.0 |
| Example 1 | 2.0 | 1.4 | 0.9 | 0.5 |
| Example 2 | 3.2 | 2.6 | 1.9 | 1.1 |
| Example 3 | 4.6 | 3.9 | 2.7 | 2.0 |
| Example 4 | 2.2 | 1.6 | 1.0 | 0.6 |

Figure 2:
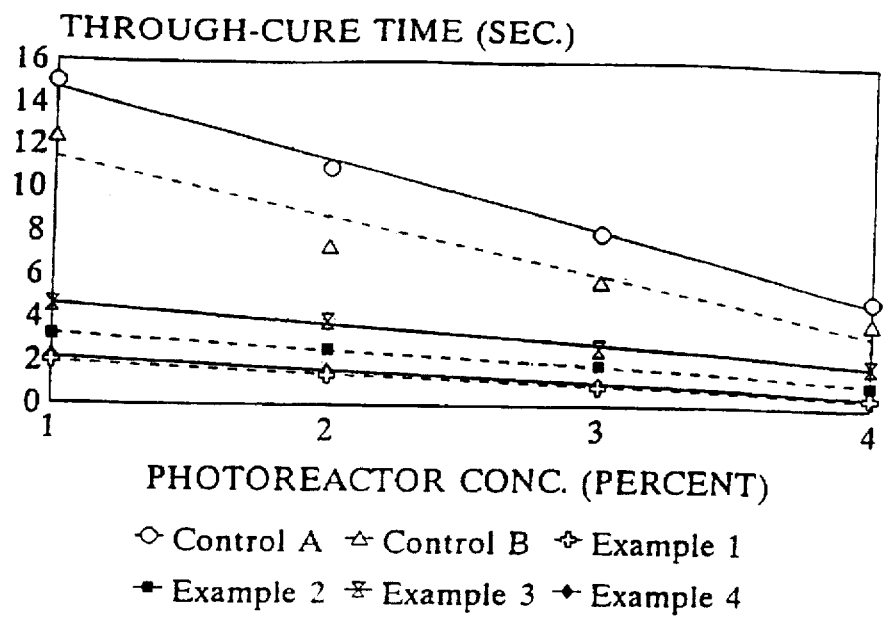
FIG. 2 is a series of plots of control photoinitiator and polymolecular photoreactor concentration in an adhesive versus through-cure times (radiation exposure times for complete curing) for two control photoinitiators and four polymolecular photoreactors of the present invention.

While the data in Tables 1 and 2 clearly demonstrate the remarkable improvements in cure rates which are achieved with the polymolecular photoreactors of the present invention, the data in Table 2 were plotted as photoreactor concentration versus through-cure time. The resulting plots, shown in FIG. 2, dramatically illustrate such remarkable improvements.

EXAMPLE 7

A series of experiments was carded out as described in Example 5, using only Control B and the polymolecular photoreactor of Example 1 in order to determine the effect of film thickness on through-cure times. In each case, the concentration of control photoinitiator or photoreactor was 4 weight percent. The results are summarized in Table 3 (the data for a film thickness of 0.6 mil are from Table 1).

TABLE 3

Summary of Through-Cure Times With Varying Film Thicknesses

| Film Thickness | | Through-Cure Time (Sec.) | |
|---|---|---|---|
| Mils | mm | Control B | Example 1 |
| 0.6 | 0.015 | 4.0 | 0.5 |
| 1.0 | 0.025 | 6.1 | 0.8 |
| 2.0 | 0.051 | 14.2 | 1.4 |
| 3.0 | 0.076 | 21.0 | 2.0 |

Figure 3:
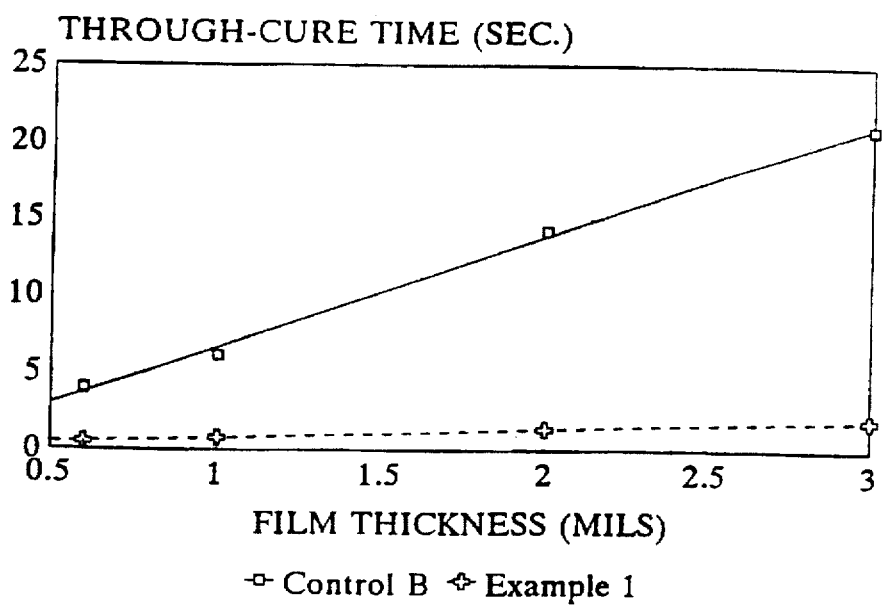
FIG. 3 consists of plots of through-cure times for a control photoinitiator and a polymolecular photoreactor of the present invention at a constant concentration in an adhesive versus film thickness.

Regardless of the film thickness employed, the polymolecular photoreactor of Example 1 clearly provided much faster curing rates. In order to better visualize the extent of improvement and any trends which may be present, the data of Table 3 were plotted as film thickness in mils versus through-cure times. The plots are shown in FIG. 3. While it is evident that film thickness affects through-cure time approximately linearly in each case, the rate of increase with increasing film thickness for the control photoinitiator is much greater than for the polymolecular photoreactor of Example 1.

It may be noted that, because of the high molar absorptivity of the polymolecular photoreactors of the present invention, film thickness/cure limitations may be observed with very thick film thicknesses. For example, a 25-mil (about 0.64-mm) adhesive film containing the photoreactor of Example 1 remained tacky on the side adjacent to the metal plate supporting the film, even though the upper surface, or top of the film, passed the scratch test.

EXAMPLE 8

The procedure of Example 1 was repeated with Control A, Control B, and the photoreactor of Example 1 in order to test the curing behavior of the films upon exposure to the radiation from another ultraviolet light source. In this case, a 550-watt, wide spectrum emission, Hanovia medium pressure mercury lamp (Hanovia Lamp Co., Newark, N.J.) was employed in place of the excimer lamp. The distance from the lamp to the sample being irradiated was about 16 inches (about 41 cm). The results are summarized in Table 4.

TABLE 4

Summary of Results with Medium Pressure Mercury Lamp

| Photoreactor | Through-Cure Time |
|---|---|
| Control A | 60 seconds |
| Control B | 90 seconds |
| Example 1 | 15 seconds |

The superiority of the polymolecular photoreactors of the present invention over known photoinitiators is clear, even when the radiation is not the essentially monochromatic emission which is characteristic of an excimer lamp. The effective tuning of the polymolecular photoreactor for a specific wavelength band permits the photoreactor to more efficiently utilize any radiation in the emission spectrum of the radiating source corresponding to the "tuned" wavelength band, even though the intensity of such radiation may be much lower than, for example, radiation from a narrow band emitter such as an excimer lamp. In other words, the effectiveness of the polymolecular photoreactor of the present invention is not dependent upon the availability or use of a narrow wavelength band radiation source.

EXAMPLE 9

Finally, the procedure of Example 5 was repeated using simple mixtures of sensitizer and photoinitiator. Two mixtures were studied. The first (Mixture A) consisted of Control A and phthaloylglycine, each being present at a level in the adhesive of 1 weight percent. The second mixture (Mixture B) consisted of Control B and phthaloylglycine: again, each component was present at a level of 1 weight percent. The results are summarized in Table 5.

TABLE 5

Summary of Results with Mixtures of Sensitizer and Photoinitiator

| Mixture | Through-Cure Time |
|---|---|
| A | 12.8 seconds |
| B | 10.1 seconds |

It will be remembered from Table 1 of Example 5 that the through-cure times for Controls A and B at levels of 1 weight percent were 15.0 and 12.4 seconds, respectively. It likewise will be remembered that the through-cure time for the bimolecular photoreactor of Example 1, also present at a level of 1 weight percent, was 2.0 seconds. Given the fact that each of the components in the mixtures summarized in Table 5 was present at a level of 1 weight percent, it is evident that mixtures of the sensitizers and photoinitiators in these Examples are essentially no more effective than the photoinitiator alone. Thus, the unique results obtained with the polymolecular photoreactors of these Examples were dependent upon the covalent bonding of the sensitizer to the free radical-generating photoinitiator. Nevertheless, it is believed that physical mixtures of the sensitizer and photoinitiator are capable of results better than those achievable with photoinitiator alone. It is postulated that such mixtures may be optimized by improving the blending and/or the amounts of the two components.

While the specification has been described in detail with respect to specific embodiments thereof, it will be appreciated that those skilled in the art, upon attaining an understanding of the foregoing, may readily conceive of alterations to, variations of, and equivalents to these embodiments. Accordingly, the scope of the present invention should be assessed as that of the appended claims and any equivalents thereto.

What is claimed is:

1. An adhesive composition comprising a photoreactor admixed with an unsaturated polymerizable material, wherein the photoreactor comprises a wavelength-specific sensitizer covalently bonded to a reactive species-generating photoinitiator and the photoreactor is 2-[p-(2-methyllactoyl) phenoxy]ethyl-1,3-dioxo-2-isoindolineacetate, having the following structure:

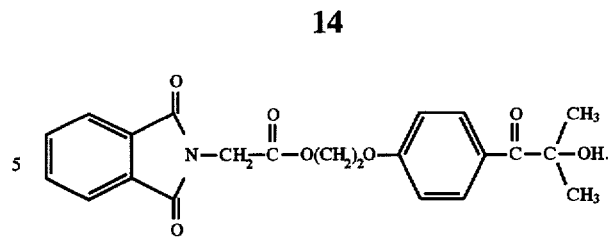

2. An adhesive composition comprising a photoreactor admixed with an unsaturated polymerizable material, wherein the photoreactor comprises a wavelength-specific sensitizer covalently bonded to a reactive species-generating photoinitiator and the photoreactor is 2-hydroxy-2-methyl-4'-[2-[p-(3-oxobutyl)phenoxy]ethoxy]propiophenone, having the following structure:

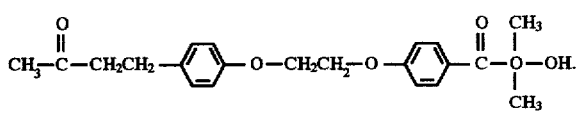

3. An adhesive composition comprising a photoreactor admixed with an unsaturated polymerizable material, wherein the photoreactor comprises a wavelength-specific sensitizer covalently bonded to a reactive species-generating photoinitiator and the photoreactor is 4-[p-[(4-benzoylcyclohexyl)oxy]-phenyl]-2-butanone, having the following structure:

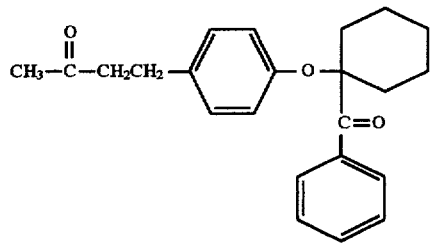

4. An adhesive composition comprising a photoreactor admixed with an unsaturated polymerizable material, wherein the photoreactor comprises a wavelength-specific sensitizer covalently bonded to a reactive species-generating photoinitiator and the photoreactor is 1,3-dioxo-2-isoindolineacetic acid, diester with 2-hydroxy-4'-(2-hydroxyethoxy)2-methylpropiophenone, having the following structure:

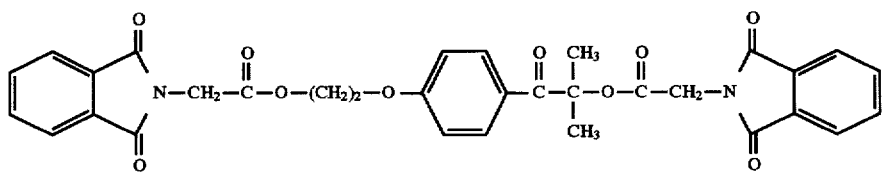

5. A laminated structure, comprising at least two layers bonded together with an adhesive composition, in which at least one layer is a cellulosic or polyolefin nonwoven web or film, wherein the adhesive composition comprises an unsaturated polymerizable material admixed with a photoreactor, the photoreactor comprising a wavelength-specific sensitizer covalently bonded to a reactive species-generating photoinitiator, and wherein the composition has been cured by exposure to radiation and the photoreactor is 2-[p-(2-methyllactoyl)

phenoxy]ethyl-1,3-dioxo-2-isoindolineacetate, having the following structure:

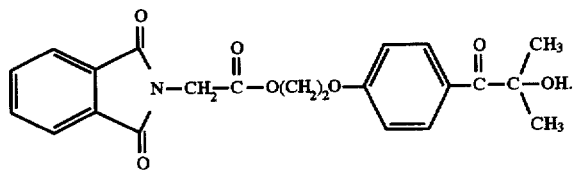

6. A laminated structure, comprising at least two layers bonded together with an adhesive composition, in which at least one layer is a cellulosic or polyolefin nonwoven web or film, wherein the adhesive composition comprises an unsaturated polymerizable material admixed with a photoreactor, the photoreactor comprising a wavelength-specific sensitizer covalently bonded to a reactive species-generating photoinitiator, and wherein the composition has been cured by exposure to radiation and the photoreactor is 2-hydroxy-2-methyl-4'-[2-[p-(3-oxobutyl)phenoxy]ethoxy]propiophenone, having the following structure:

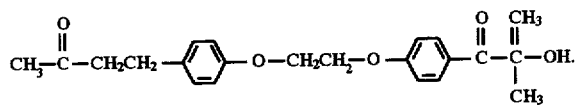

7. A laminated structure, comprising at least two layers bonded together with an adhesive composition, in which at least one layer is a cellulosic or polyolefin nonwoven web or film, wherein the adhesive composition comprises an unsaturated polymerizable material admixed with a photoreactor, the photoreactor comprising a wavelength-specific sensitizer covalently bonded to a reactive species-generating photoinitiator, and wherein the composition has been cured by exposure to radiation and the photoreactor is 4-[p-[(4-benzoylcyclohexyl)oxy]phenyl]-2-butanone, having the following structure:

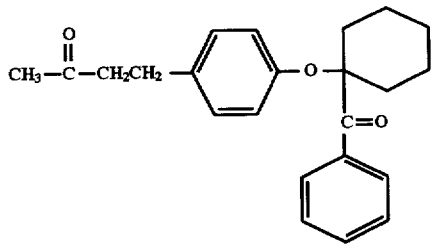

8. A laminated structure, comprising at least two layers bonded together with an adhesive composition, in which at least one layer is a cellulosic or polyolefin nonwoven web or film, wherein the adhesive composition comprises an unsaturated polymerizable material admixed with a photoreactor, the photoreactor comprising a wavelength-specific sensitizer covalently bonded to a reactive species-generating photoinitiator, and wherein the composition has been cured by exposure to radiation and the photoreactor is 1,3-dioxo-2-isoindolineacetic acid, diester with 2-hydroxy-4'-(2-hydroxyethoxy)2-methylpropiophenone, having the following structure:

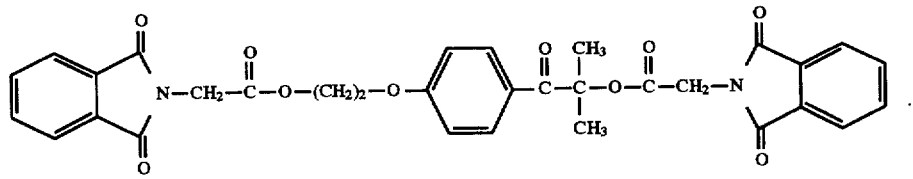

9. A method of laminating a structure, comprising the steps of:

providing a structure comprising at least two layers, in which at least one layer is a cellulosic or polyolefin nonwoven web or film, with an adhesive composition between said layers, and irradiating the adhesive composition to cure the adhesive composition, wherein the adhesive composition comprises a photoreactor admixed with an unsaturated polymerizable material, the photoreactor comprises a wavelength-specific sensitizer covalently bonded to a reactive species-generating photoinitiator, and the photoreactor is 2-[p-(2-methyllactoyl)phenoxy]ethyl-1,3-dioxo-2-isoindolineacetate, having the following structure:

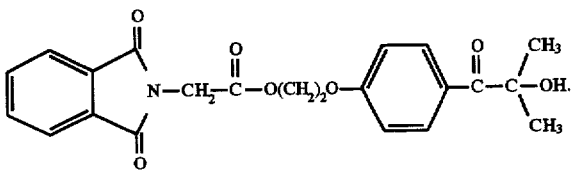

10. A method of laminating a structure, comprising the steps of:

providing a structure comprising at least two layers, in which at least one layer is a cellulosic or polyolefin nonwoven web or film, with an adhesive composition between said layers, and irradiating the adhesive composition to cure the adhesive composition, wherein the adhesive composition comprises a photoreactor admixed with an unsaturated polymerizable material, the photoreactor comprises a wavelength-specific sensitizer covalently bonded to a reactive species-generating photoinitiator, and the photoreactor is 2-hydroxy-2-methyl-4'-[2-[p-(3-oxobutyl)phenoxy] ethoxy]propiophenone, having the following structure:

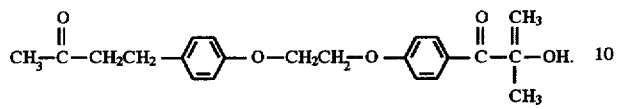

11. A method of laminating a structure, comprising the steps of:

providing a structure comprising at least two layers, in which at least one layer is a cellulosic or polyolefin nonwoven web or film, with an adhesive composition between said layers, and irradiating the adhesive composition to cure the adhesive composition, wherein the adhesive composition comprises a photoreactor admixed with an unsaturated polymerizable material, the photoreactor comprises a wavelength-specific sensitizer covalently bonded to a reactive species-generating photoinitiator, and the photoreactor is 4-[p-[(4-benzoylcyclohexyl)oxy]-phenyl]-2-butanone, having the following structure:

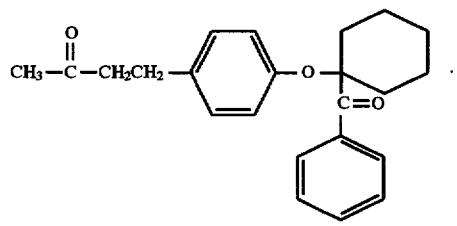

12. A method of laminating a structure, comprising the steps of:

providing a structure comprising at least two layers, in which at least one layer is a cellulosic or polyolefin nonwoven web or film, with an adhesive composition between said layers, and irradiating the adhesive composition to cure the adhesive composition, wherein the adhesive composition comprises a photoreactor admixed with an unsaturated polymerizable material, the photoreactor comprises a wavelength-specific sensitizer covalently bonded to a reactive species-generating photoinitiator, and the photoreactor is 1,3-dioxo-2-isoindolineacetic acid, diester with 2-hydroxy-4'-(2-hydroxyethoxy)2-methylpropiophenone, having the following structure:

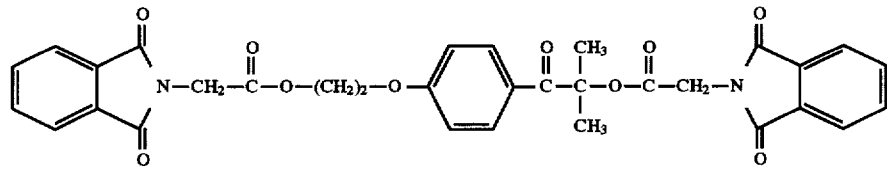

* * * * *